(12) United States Patent
Nakanishi et al.

(10) Patent No.: US 8,917,196 B2
(45) Date of Patent: Dec. 23, 2014

(54) SAMPLING CIRCUIT, A/D CONVERTER, D/A CONVERTER, AND CODEC

(71) Applicant: Asahi Kasei Microdevices Corporation, Tokyo (JP)

(72) Inventors: Junya Nakanishi, Tokyo (JP); Yutaka Nakanishi, Tokyo (JP); Seiko Nakamoto, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 13/882,323

(22) PCT Filed: Dec. 27, 2012

(86) PCT No.: PCT/JP2012/008400
§ 371 (c)(1),
(2), (4) Date: Apr. 29, 2013

(87) PCT Pub. No.: WO2013/111252
PCT Pub. Date: Aug. 1, 2013

(65) Prior Publication Data
US 2014/0062742 A1    Mar. 6, 2014

(30) Foreign Application Priority Data

Jan. 24, 2012 (JP) ................................. 2012-012368
Feb. 24, 2012 (JP) ................................. 2012-038980
Mar. 29, 2012 (JP) ................................. 2012-077087

(51) Int. Cl.
H03M 1/00    (2006.01)
H03M 1/12    (2006.01)
H03M 1/06    (2006.01)
H03M 1/66    (2006.01)

(52) U.S. Cl.
CPC .......... *H03M 1/1245* (2013.01); *H03M 1/0656* (2013.01); *H03M 1/12* (2013.01); *H03M 1/66* (2013.01)
USPC ............................ 341/122; 341/144; 341/155

(58) Field of Classification Search
CPC ..... G11C 27/024; G11C 27/02; H03M 3/496; H03M 3/494
USPC .................................. 341/118, 155, 144, 122
See application file for complete search history.

(56) References Cited

U.S. PATENT DOCUMENTS

5,548,748 A    8/1996   Fuse
5,698,999 A   12/1997   Etoh et al.
(Continued)

FOREIGN PATENT DOCUMENTS

JP    62-006536    1/1987
JP    03-075976    3/1991
(Continued)

OTHER PUBLICATIONS

Japanese Office Action dated Oct. 29, 2013, for the related Japanese Patent Application No. 2013-511202.
(Continued)

*Primary Examiner* — Brian Young
(74) *Attorney, Agent, or Firm* — Morgan, Lewis & Bockius LLP

(57) ABSTRACT

An A/D converter comprising: a sampling circuit including a continuous section, a sampling and holding section for intermittently sampling an input signal based on an analog signal input from the continuous section to hold and transfer the sampled signal, and a digital section for outputting a signal transferred from the sampling and holding section as a digital signal; and a control circuit for supplying a clock signal in which jitter is not added to the continuous section and supplying a clock signal in which the jitter is added to the sampling and holding section.

20 Claims, 29 Drawing Sheets

(56) References Cited

U.S. PATENT DOCUMENTS

| | | |
|---|---|---|
| 7,113,117 B1 | 9/2006 | Pentakota et al. |
| 7,671,773 B2 * | 3/2010 | Ceballos ................. 341/143 |
| 7,852,248 B1 * | 12/2010 | Keramat et al. ............ 341/143 |
| 8,004,435 B2 | 8/2011 | Waki et al. |
| 8,169,352 B2 * | 5/2012 | Sornin et al. ............. 341/143 |
| 8,203,472 B2 * | 6/2012 | Robinson ................. 341/118 |
| 2006/0055436 A1 | 3/2006 | Gaboriau et al. |
| 2012/0176261 A1 | 7/2012 | Ishioka et al. |

FOREIGN PATENT DOCUMENTS

| | | |
|---|---|---|
| JP | 08-273388 | 10/1996 |
| JP | 2001-006384 | 1/2001 |
| JP | 2006081165 A | 3/2006 |
| JP | 2006-092483 A | 4/2006 |
| JP | 2009-124447 | 6/2009 |
| JP | 2009-130579 | 6/2009 |
| JP | 2010-193089 | 9/2010 |
| JP | 2010-226356 A | 10/2010 |
| JP | 2011-040941 A | 2/2011 |
| JP | 2012-147079 | 8/2012 |
| JP | 2012-147153 | 8/2012 |

OTHER PUBLICATIONS

Japanese Office Action dated Feb. 18, 2014.

JPO: Office Action for Japanese Patent Application No. JP 2013-511202—Issued on May 13, 2014—Including English Machine Translation.

Written Opinion of the International Searching Authority dated Jun. 21, 2013, for the corresponding international application No. PCT/JP2012/008400.

Office Action dated Aug. 13, 2013 for corresponding Japanese Patent Application No. 2013-511201.

International Search Report dated Feb. 5, 2013, for the related international application No. PCT/JP2012/008402.

Written Opinion of the International Searching Authority dated Aug. 1, 2013, for the related international application No. PCT/JP2012/008402.

English Translation of the International Search report for International Application PCT/JP2012/008400, mailed Feb. 5, 2013.

* cited by examiner

FIG. 13
(a) 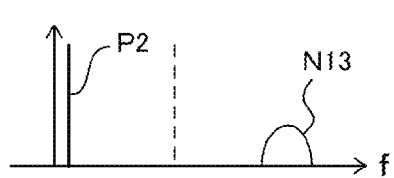
(b) 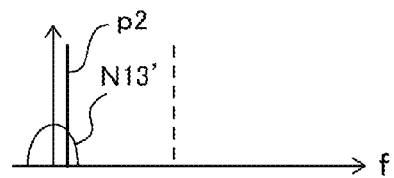
FIG. 14
(a) 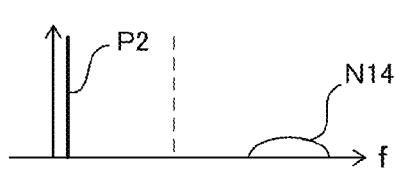
(b) 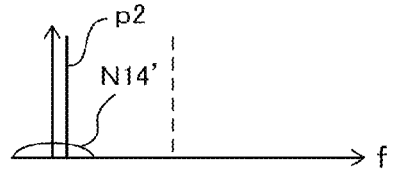
FIG. 15
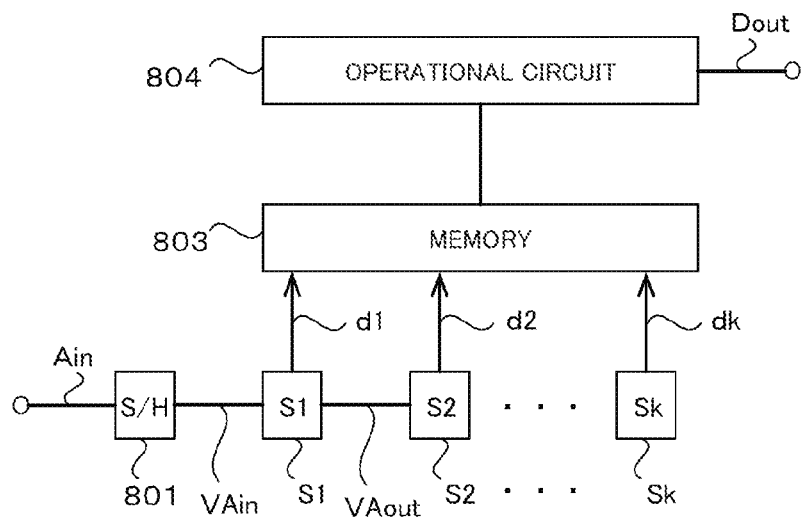
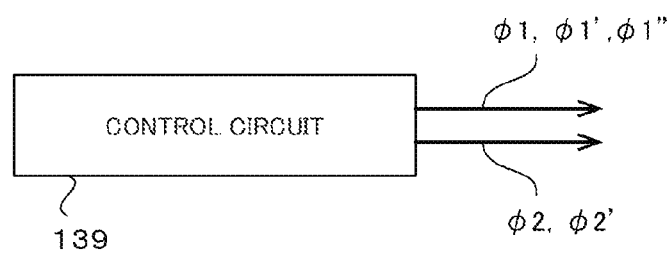

FIG. 32
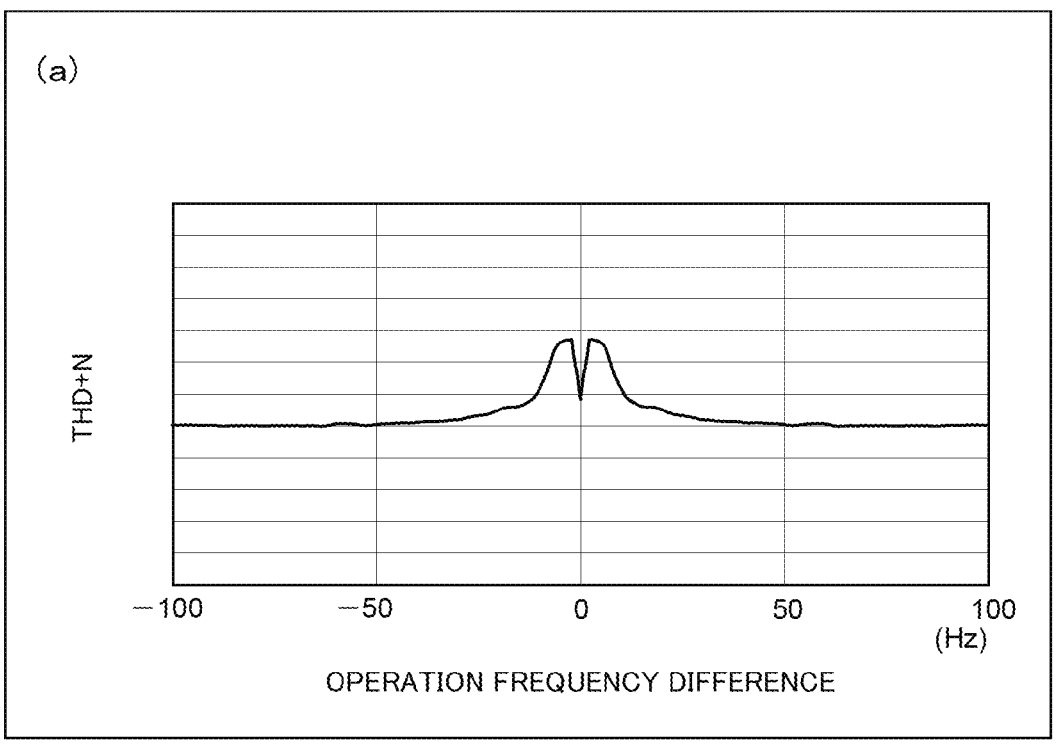
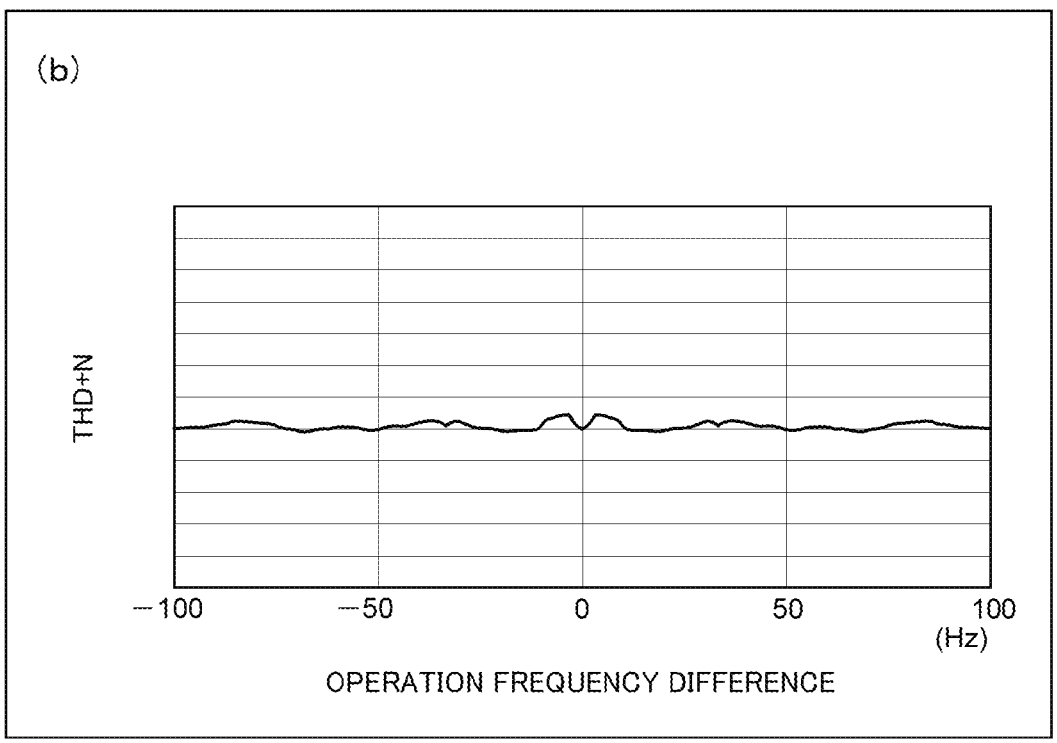

US 8,917,196 B2

SAMPLING CIRCUIT, A/D CONVERTER, D/A CONVERTER, AND CODEC

TECHNICAL FIELD

The present invention relates to a sampling circuit and an A/D converter, a D/A converter, and a CODEC, each including the sampling circuit.

BACKGROUND ART

At the present time, a decrease in the size of electronic devices are demanded more and more, the sizes of electronic components mounted on electronic devices are decreased, so that electronic components are arranged closer to each other. When such electronic components are arranged close to each other, noise generated in an electronic component may be transmitted to other electronic components directly or through a mounting board or wires and may hinder normal operations of other electronic components. Accordingly, suppression of an influence of noise along with a decrease in size are requested for electronic devices these years (hereinafter, referred to as anti-noise measures).

In order to prevent noise generated in an electronic component from influencing on other electronic components, it is generally conceivable that electronic components may be arranged so as to be separated from each other to such an extent as to reduce the influence of noise or that arrangement or separation of elements may be designed in processes of manufacturing the electronic components. It is also conceivable that input and output terminals being independently provided for individual electronic components.

However, the arrangement of the electronic components to be separated from each other hinders a decrease in the size of electronic devices, which is not preferable. In order to prevent noise from influencing on the outside through the use of processes of manufacturing the electronic components, advanced process technology is needed and the manufacturing cost is increased as a result, which is not preferable. Separation of the input terminal or the output terminal of the electronic components increases the number of pins of electronic devices and is disadvantageous for decreasing the size of the electronic components.

Examples of the electronic components mounted on electronic devices include a D/A converter and an A/D converter. The D/A converter and the A/D converter are electronic components widely used for audio functions of electronic devices and are electronic components particularly necessitating the anti-noise measures.

As a technique for the anti-noise measures for the D/A converter and the A/D converter, for example, the invention described in Patent Document 1 is known. In the invention described in Patent Document 1, jitter is added to a synchronization signal (control clock signal) of an input signal of the D/A converter or the A/D converter. According to the invention described in Patent Document 1, it is possible to disperse radiation of beat noise due to a synchronization signal (conversion clock signal) used to output an output signal and the control clock signal.

Such conventional techniques were made on the basis of a thought that radiation noise generated from the A/D converter or the D/A converter is reduced to reduce an influence of noise on other equipment.

PRIOR ART DOCUMENTS PATENT DOCUMENT

Patent Document 1: JP S62-6536 A

SUMMARY OF THE INVENTION

Problem to be Solved

However, even when radiation noise generated from the D/A converter or the A/D converter is reduced as described in the conventional techniques, the influence of the generated noise on the other cannot be satisfactorily reduced.

In the conventional techniques, since the jitter is added to a digital section only, periodic noise due to inrush current in an analog section cannot be dispersed. Accordingly, the dispersion effect of the conventional techniques is restrictive.

In order to reduce the direct or indirect influence of radiation noise generated from individual electronic components on the D/A converter and the A/D converter using the conventional technique, a circuit for inputting jitter should be provided to other components mounted on an electronic apparatus. In this configuration, it is necessary to provide plural circuits for inputting the jitter, which hinders a decrease in the size of the electronic apparatus.

The present invention has been made in consideration of the above-mentioned circumstances, and an object thereof is to provide a sampling circuit which does not hinder a decrease in the size of electronic components and which can reduce an influence of noise on the electronic components mounted on an electronic device while avoiding advanced process technology, an A/D converter and a D/A converter each including the sampling circuit, and a CODEC in which the A/D converter and the D/A converter are combined.

Solution to the Problem

Hereinafter, a digital section includes a general digital circuit and transfers a signal which is quantized and sampled. A sampling and holding section includes a general switched-capacitor circuit (SC circuit) and transfers a signal which is not quantized but is sampled. A continuous section includes a general continuous signal circuit (continuous circuit) and transfers a signal which is not quantized and is not sampled.

According to an aspect of the present invention, there is provided a sampling circuit including: a continuous section (for example, a continuous section 130a shown in FIG. 18) for transmitting a continuous signal; a sampling and holding section (for example, a sampling and holding section 130b shown in FIG. 18) for operating in response to a first clock signal (for example, a clock signal $\phi 2'$ shown in FIG. 18) connected to the continuous section to transmit a signal which is sampled but not quantized; and a digital section (for example, a digital section 130c shown in FIG. 18) connected to the sampling and holding section to transmit a signal which is sampled and quantized, wherein the first clock signal is a signal in which jitter is added to a basic clock signal.

The continuous section may sample an input analog signal, and the sampling and holding section may hold the signal sampled by the continuous section.

The continuous section (for example, a continuous section 130a shown in FIG. 18) may operate in response to a second clock signal (for example, a clock signal $\phi 1$ shown in FIG. 18), the second clock signal may be a signal in which the jitter is not added to the basic clock signal, that is, the basic clock signal itself, and the first clock signal (for example, a clock signal $\phi 2'$ shown in FIG. 18) and the second clock signal may have a reverse-phased and non-overlapping relationship.

The continuous section (for example, a continuous section 130a shown in FIG. 22) may operate in response to a second clock signal (for example, a clock signal $\phi 1''$ shown in FIG. 22), the second clock signal may be a signal in which the jitter is added to an edge which is a trigger for determining an operation start time of the basic clock signal and the jitter is not added to an edge which is a trigger for determining an operation end time, and the first clock signal (for example, a clock signal φ2' shown in FIG. 22) and the second clock signal may have a reverse-phased and non-overlapping relationship.

The sampling and holding section (for example, a sampling and holding section 150b shown in FIG. 24) may sample a reference signal based on a digital signal from the digital section (for example, a digital section 150c shown in FIG. 24), and the continuous section (for example, a continuous section 150a shown in FIG. 24) may transfer the signal sampled by the sampling and holding section as an analog signal.

The continuous section (for example, a continuous section 150a shown in FIG. 24) may operate in response to a second clock signal (for example, a clock signal φ12 shown in FIG. 24), the second clock signal may be a signal in which the jitter is not added to the basic clock signal, that is, the basic clock signal itself, and the first clock signal (for example, a clock signal φ11' shown in FIG. 24) and the second clock signal may have a reverse-phased and non-overlapping relationship.

The continuous section (for example, a continuous section 150a shown in FIG. 28) may operate in response to a second clock signal (for example, a clock signal φ12" shown in FIG. 28), the second clock signal may be a signal in which the jitter is not added to an edge which is a trigger for determining an operation start time of the basic clock signal and the jitter is added to an edge which is a trigger for determining an operation end time, and the first clock signal (for example, a clock signal φ11' shown in FIG. 28) and the second clock signal may have a reverse-phased and non-overlapping relationship.

According to another aspect of the present invention, there is provided an A/D converter including: a sampling circuit (for example, a sampling circuit 140 shown in FIG. 18) including a continuous section (for example, a continuous section 130a shown in FIG. 18) for sampling an input analog signal, a sampling and holding section (for example, a sampling and holding section 130b shown in FIG. 18) for holding the signal sampled by the continuous section, and a digital section (for example, a digital section 130c shown in FIG. 18) for outputting the signal from the sampling and holding section as a digital signal; and a clock signal supply section (for example, a control circuit 139 shown in FIG. 18) for supplying a first clock signal (for example, a clock signal φ2' shown in FIG. 18) to the sampling and holding section, wherein the first clock signal is a signal in which jitter is added to a basic clock signal.

The clock signal supply section may supply a second clock signal (for example, a clock signal φ1 shown in FIG. 18) to the continuous section (for example, a continuous section 130a shown in FIG. 18), the second clock signal may be a signal in which the jitter is not added to the basic clock signal, that is, the basic clock signal itself, and the first clock signal (for example, a clock signal φ2' shown in FIG. 18) and the second clock signal may have a reverse-phased and non-overlapping relationship.

The sampling and holding section (for example, a sampling and holding section 130b shown in FIG. 17) may include a capacitive element (for example, a capacitor 132 shown in FIG. 17) for accumulating charge generated due to the analog signal and a first switching element (for example, a switch 133 shown in FIG. 17) for holding and transferring the charge accumulated in the capacitive element to the digital section (for example, a digital section 130c shown in FIG. 18), and the first switching element may perform an ON operation and an OFF operation in response to the first clock signal (for example, a clock signal φ2' shown in FIG. 17).

The clock signal supply section (for example, a control circuit 139 shown in FIG. 22) may supply a second clock signal to the continuous section (for example, a continuous section 130a shown in FIG. 22), and the second clock signal may be a signal in which the jitter is added to an edge which is a trigger for determining an operation start time in the basic clock signal and the jitter is not added to an edge which is a trigger for determining an operation end time.

The sampling and holding section (for example, a sampling and holding section 130b shown in FIG. 21) includes a capacitive element (for example, a capacitor 132 shown in FIG. 21) for accumulating charge generated by the analog signal and a first switching element (for example, a switch 133 shown in FIG. 21) for holding and transferring the charge accumulated in the capacitive element to the digital section (for example, a digital section 130c shown in FIG. 22), the first switching element may perform an ON operation and an OFF operation in response to the first clock signal (for example, a clock signal φ2' shown in FIG. 21), the continuous section (for example, a continuous section 130a shown in FIG. 21) may include a second switching element (for example, switches 131 and 135 shown in FIG. 21) for accumulating the charge in the capacitive element, and the second switching element may perform an ON operation and an OFF operation in response to the second clock signal (for example, a clock signal φ1" shown in FIG. 21).

The clock signal supply section (for example, a control circuit 139 shown in FIG. 18) may supply the first clock signal (for example, a clock signal φ2' shown in FIG. 18) to the digital section (for example, a digital section 130c shown in FIG. 18).

According to still another aspect of the present invention, there is provided a D/A converter including: a sampling circuit (for example, a sampling circuit 160 shown in FIG. 24) including a digital section (for example, a digital section 150c shown in FIG. 24) for outputting a digital signal, a sampling and holding section (for example, a sampling and holding section 150b shown in FIG. 24) for sampling a reference signal based on the digital signal, and a continuous section (for example, a continuous section 150a shown in FIG. 24) for transferring the signal sampled by the sampling and holding section as an analog signal; and a clock signal supply section (for example, a control circuit 159-1 shown in FIG. 24) for supplying a first clock signal (for example, a clock signal φ11' shown in FIG. 24) to the sampling and holding section, wherein the first clock signal is a signal in which jitter is added to a basic clock signal.

The clock signal supply section (for example, a control circuit 159-1 shown in FIG. 24) may supply a second clock signal (for example, a clock signal φ12 shown in FIG. 24) to the continuous section (for example, a continuous section 150a shown in FIG. 24), the second clock signal may be a signal in which the jitter is not added to the basic clock signal, that is, the basic clock signal itself, and the first clock signal and the second clock signal may have a reverse-phased and non-overlapping relationship.

The sampling and holding section (for example, a sampling and holding section 150b shown in FIG. 23) may include a capacitive element (for example, a capacitor 152 shown in FIG. 23) for accumulating the charge generated by the reference signal and a first switching element (for example, switches 151 and 153 shown in FIG. 23) for accumulating the charge in the capacitive element, and the first switching element may perform an ON operation and an OFF operation in response to the first clock signal (for example, a clock signal φ11' shown in FIG. 23).

The clock signal supply section (for example, a control circuit 159-2 shown in FIG. 28) may supply a second clock signal (for example, a clock signal φ12" shown in FIG. 28) to the continuous section (for example, a continuous section 150a shown in FIG. 28), the second clock signal may be a signal in which the jitter is not added to an edge which is a trigger for determining an operation start time of the basic clock signal and the jitter is added to an edge which is a trigger for determining an operation end time, and the first clock signal (for example, a clock signal φ11' shown in FIG. 28) and the second clock signal may have a reverse-phased and non-overlapping relationship.

The sampling and holding section (for example, a sampling and holding section 150b shown in FIG. 27) may include a capacitive element for example, a capacitor 152 shown in FIG. 27) for accumulating the charge generated by the reference signal and a first switching element (for example, switches 151 and 153 shown in FIG. 27) for accumulating the charge in the capacitive element, the first switching element may perform an ON operation and an OFF operation in response to the first clock signal (for example, a clock signal φ11' shown in FIG. 27), the continuous section (for example, a continuous section 150a shown in FIG. 27) may include a second switching element (for example, switches 156 and 157 shown in FIG. 27) for transferring the charge accumulated in the capacitive element (for example, a capacitor 152 shown in FIG. 27), and the second switching element may perform an ON operation and an OFF operation in response to the second clock signal (for example, a clock signal φ12" shown in FIG. 27).

The clock signal supply section (for example, a control circuit 159-1 shown in FIG. 24) may supply the first clock signal (for example, a clock signal φ11' shown in FIG. 24) to the digital section (for example, a digital section 150c shown in FIG. 24).

According to still another aspect of the present invention, there is provided a CODEC including the A/D converter (for example, an A/D converter ADC shown in FIG. 31) according to any one of claims 8 to 13 and the D/A converter (for example, a D/A converter DAC shown in FIG. 31) according to any one of claims 14 to 19 which are combined therein.

The A/D converter and the D/A converter may operate asynchronously.

Advantageous Effects of the Invention

According to the aspects of the present invention, it is possible to provide a sampling circuit which can reduce an influence of noise on electronic components mounted on an electronic device, an A/D converter and a D/A converter including the sampling circuit, and a CODEC in which the A/D converter and the D/A converter are combined. Since this advantage is achieved by causing the sampling and holding section to operate in response to the clock signal having jitter added thereto, the decrease in the size of the electronic components is not hindered. It is also not necessary to advance the process technology.

Since radiation noise due to inrush current in an analog section can be dispersed by causing the continuous section to operate on the basis of the clock signal having jitter added thereto, it is possible to effectively suppress the radiation noise.

BRIEF DESCRIPTION OF THE DRAWINGS

FIGS. 13(a)-(b) are diagrams illustrating periodic noise when jitter is added to a clock signal for causing a digital section to operate in an A/D converter according to the second aspect of the present invention;

FIGS. 14(a)-(b) are diagrams illustrating periodic noise when the jitter is added to a clock signal for causing a digital section to operate in an A/D converter according to the second aspect of the present invention;

FIG. 15 is a diagram illustrating a pipelined A/D converter according to Embodiment 1;

FIGS. 32(a)-(b) are diagrams illustrating effects of Embodiment 3; and

DESCRIPTION OF EMBODIMENTS

Hereinafter, the invention will be described.

First, a concept of a sampling circuit according to the present invention will be described before describing embodiments of the present invention. In the following description, a D/A converter employing the sampling circuit according to this embodiment will be described as an example.

A digital section includes a general digital circuit and transmits a signal which is quantized and sampled. A sampling and holding section includes a general switched-capacitor circuit (SC circuit) and transmits a signal which is not quantized but sampled. A continuous section includes a general continuous signal circuit (continuous circuit) and transmits a signal which is not quantized and not sampled.

Figure 1:
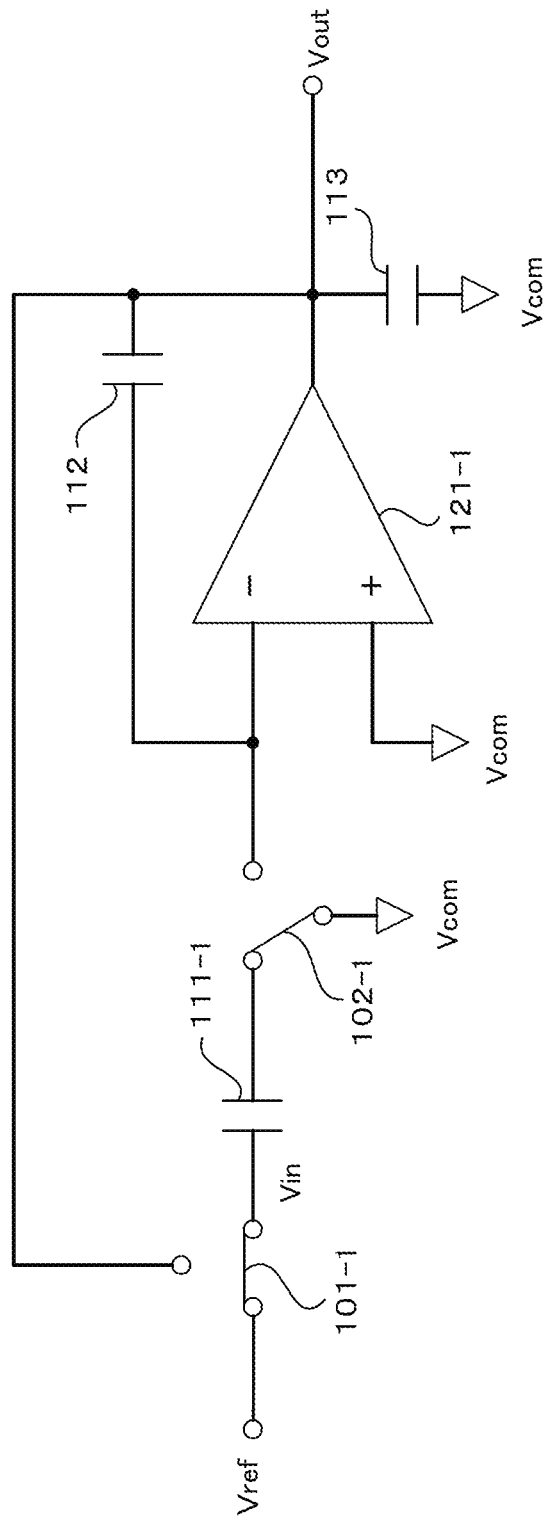
FIG. 1 is a diagram illustrating a sampling circuit according to a first aspect of the present invention.

A sampling circuit shown in FIG. 1 is a sampling circuit according to an aspect (hereinafter, referred to as a "first aspect") serving as a basis of this embodiment and a sampling circuit in a D/A converter according to a first aspect.

The sampling circuit shown in FIG. 1 includes a sampling and holding section that samples and holds a signal, a continuous section that processes an analog signal, capacitors 111-1, 112, and 113, and an operational amplifier 121-1. In FIG. 1, a digital section that handles a digital signal is not shown.

A reference signal $V_{ref}$ (the sampled reference signal $V_{ref}$ is referred to as an input signal $V_{in}$) sampled by switches 101-1 and 102-1 is applied to the capacitor 111-1 and charge is accumulated therein. The charge accumulated in the capacitor 111-1 is input to the inverting input terminal of the operational amplifier 121-1 by switching of the switches 101-1 and 102-1. The operational amplifier 121-1 receives an input of a reference signal $V_r$ from the non-inverting input terminal and outputs an analog output signal $V_{out}$.

In the circuit configuration shown in FIG. 1, when noise is superimposed on a reference signal $V_{ref}$ and a reference signal $V_{com}$, the noise appears as an output waveform at a gain of 0 dB. Accordingly, the sensitivity to noise is the highest at a gain of 0 dB. In the first aspect, a case where noise is superimposed on the reference signal $V_{ref}$ will be described, but the same consideration can be applied to a case where noise is superimposed on a signal other than the reference signal $V_{ref}$. An example thereof is the reference signal $V_{com}$.

Figure 2:
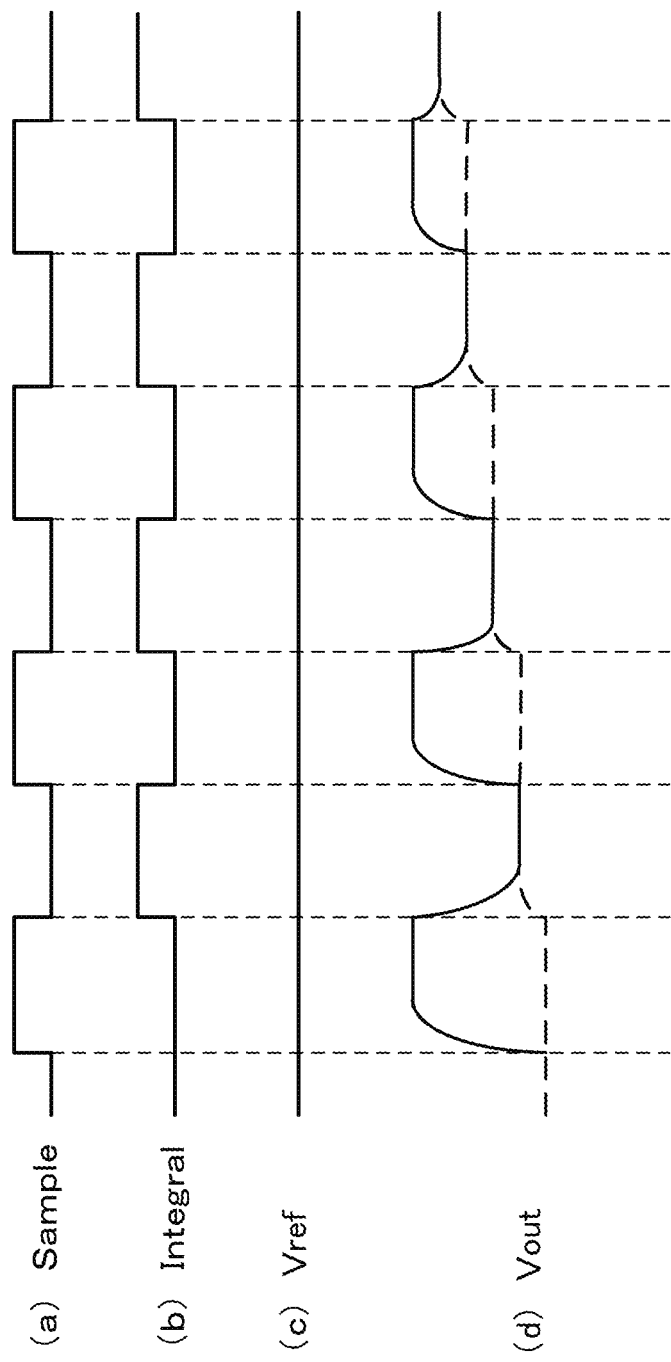
FIGS. 2(a)-(d) are diagrams illustrating an operation of the sampling circuit when periodic noise is not present in a reference signal $V_{ref}$.

(a) to (d) of FIG. 2 are diagrams illustrating the operation of the D/A converter shown in FIG. 1 when periodic noise is not present in the reference signal $V_{ref}$.

(a) of FIG. 2 shows a sampling timing of the reference signal $V_{ref}$, (b) of FIG. 2 shows a timing at which the capacitor 111-1 holds and discharge charge accumulated by an input signal $V_{in}$, (c) of FIG. 2 shows the reference signal $V_{ref}$ which is a DC voltage, and (d) of FIG. 2 shows an output signal $V_{out}$ which is analog signal output from the operational amplifier 121-1. In (d) of FIG. 2, the signal indicated by a solid line is an input signal $V_{in}$ generated by the charge transferred from the capacitor 111-1 and an output signal $V_{out}$ indicated by a dotted line is generated by feedback through the capacitor 112.

Figure 3:
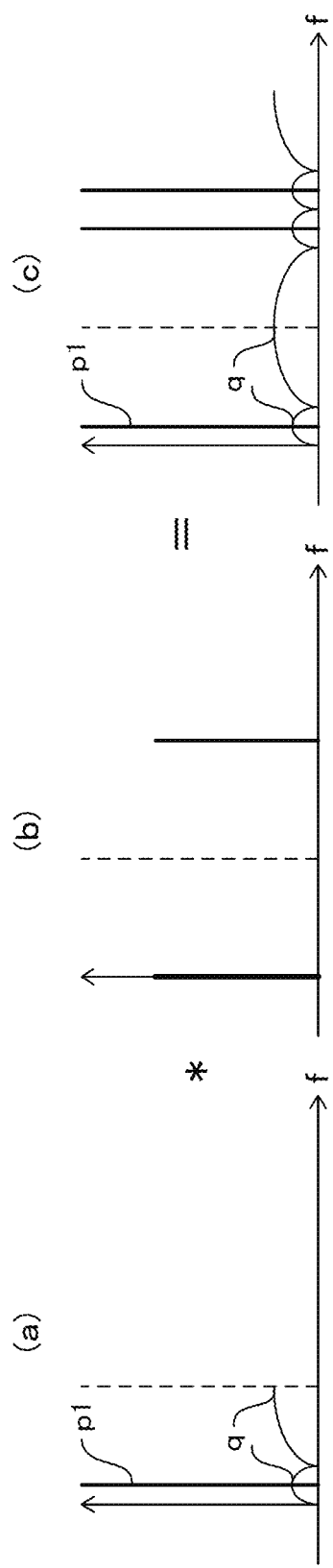
FIGS. 3(a)-(c) are diagrams illustrating a signal output from the sampling circuit.

FIG. 3 is a diagram illustrating a mechanism in which the input signal $V_{in}$ appears in the output signal $V_{out}$. Graph (a) of FIG. 3 is a diagram illustrating signals output from the capacitor 111-1 shown in FIG. 1 and shows a spectrum obtained by transforming the input signal $V_{in}$ to a frequency axis by Fourier transform.

Graph (b) of FIG. 3 shows a spectrum obtained by transforming a clock signal for managing the timings at which the capacitor 111-1 holds and discharges the charge accumulated by the input signal $V_{in}$ to the frequency axis by Fourier transform. Graph (c) of FIG. 3 shows a spectrum obtained by transforming the output signal $V_{out}$ to the frequency axis by Fourier transform.

In any of graphs (a), (b), and (c) of FIG. 3, the vertical axis represents the spectral intensity of a signal and the horizontal axis represents the frequency. The position of the vertical axis indicated by an arrow in graphs (a), (b), and (c) of FIG. 3 represents the frequency reference ("0").

As shown in graph (a) of FIG. 3, the signal (indicated by a spectrum p1 in the drawing) output from the capacitor 111-1 has a constant frequency. A spectrum q represents noise in the form of floor noise in the input signal $V_{in}$. When the spectrums p1 and q are sampled, held, and discharged by the switches 101-1 and 102-1, the output signal $V_{out}$ shown in graph (c) is generated by convolution. In the output signal $V_{out}$, the spectrums p1 and q are mirror symmetrical about the dotted line shown in graph (c).

A case where periodic noise is present in the reference signal $V_{ref}$ will be described below.

Figure 4:
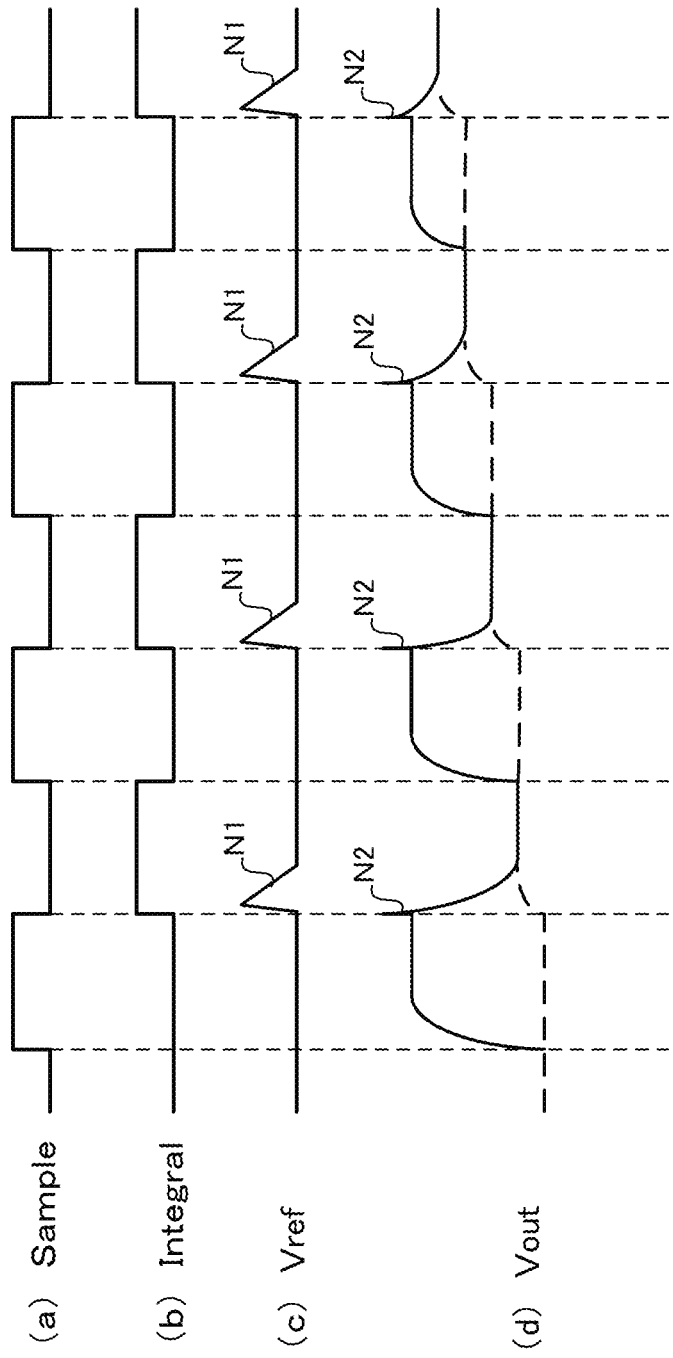
FIGS. 4(a)-(d) are diagrams illustrating an operation of the sampling circuit when periodic noise is present in a reference signal $V_{ref}$.

(a) to (d) of FIG. 4 are diagrams illustrating the operation of the D/A converter when periodic noise is present in the reference signal $V_{ref}$ in the sampling circuit shown in FIG. 1.

(a) of FIG. 4 shows the sampling timing of the reference signal $V_{ref}$.

(b) of FIG. 4 shows the timings at which the capacitor 111-1 holds and discharge the charge accumulated by the reference signal $V_{ref}$. The switches supplied with the clock signals shown in (a) and (b) of FIG. 4 are turned on in a section in which the clock signals are at a high level and are turned off in a section in which the clock signals are at a low level.

(c) of FIG. 4 shows the reference signal $V_{ref}$ which is a DC voltage and (d) of FIG. 4 shows the output signal $V_{out}$ as an analog signal which is output from the operational amplifier 121-1.

When periodic noise N1 shown in (c) of FIG. 4 is present in the reference signal $V_{ref}$, periodic noise N2 corresponding to the periodic noise N1 is generated in the output signal $V_{out}$ shown in (d) of FIG. 4 in the D/A converter.

The periodic noise shown in (c) and (d) of FIG. 4 will be described below with reference to graphs (a), (b), and (c) of FIG. 5.

Figure 5:
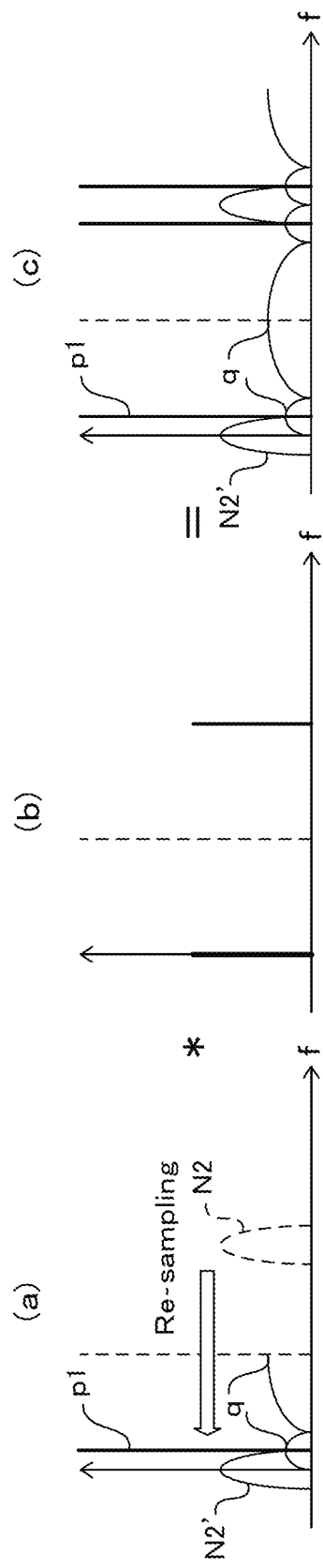
FIGS. 5(a)-(c) are diagrams illustrating periodic noise.

FIG. 5 is a diagram illustrating a mechanism in which the input signal $V_{in}$ and the periodic noise appear in the output signal $V_{out}$. Graph (a) of FIG. 5 is a diagram illustrating the signal output from the capacitor 111-1 shown in FIG. 1 and shows a spectrum obtained by transforming the input signal $V_{in}$ to the frequency axis by Fourier transform.

Graph (b) of FIG. 5 shows a spectrum obtained by transforming a clock signal for managing the timings at which the capacitor 111-1 holds and discharge the charge accumulated by the input signal $V_{in}$ to the frequency axis by Fourier transform. Graph (c) shows a spectrum obtained by transforming the output signal $V_{out}$ to the frequency axis by Fourier transform.

In any of graphs (a), (b), and (c) of FIG. 5, the vertical axis represents the spectral intensity of a signal and the horizontal axis represents the frequency. The position of the vertical axis indicated by an arrow in graphs (a), (b), and (c) represents the frequency reference ("0").

When the spectrums shown in graph (a) of FIG. 5 are sampled, held, and discharged by the switches 101-1 and 102-1 shown in FIG. 1, periodic noise N2 is replicated and periodic noise N2' appears near the DC. As shown in graph (c) of FIG. 5, the periodic noise N2' is mirror symmetrical about the dotted line in graph (c) due to convolution and the output signal $V_{out}$ is generated. The periodic noise N2' appears in the frequency band (hereinafter, also referred to as in-band) used for an output audio, when the D/A converter is used, for example, in an audio device.

The first aspect has been made on the basis of a technical thought that periodic noise appearing in the in-band due to a signal output from another device is dispersed to prevent signal quality of an output signal such as an audio from being damaged, by adding jitter to a clock signal causing a device such as a sampling circuit to operate.

In order to clearly understand differences between the present invention and the related art, the related art described in Patent Document 1 will be described below.

An A/D converter and a D/A converter include a sampling circuit having a digital section that processes digital signals which are non-continuous signals, a sampling and holding section (S/H section) that samples and holds a signal, and a continuous section that processes analog signals which are continuous signals.

Figure 6:
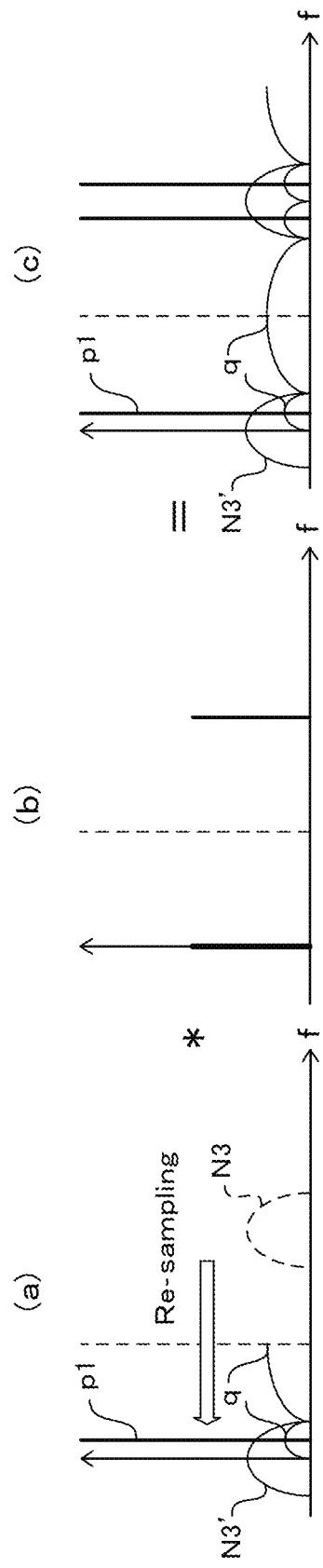
FIGS. 6(a)-(c) are diagrams illustrating periodic noise when jitter is added to a clock signal of a digital section in a D/A converter including the sampling circuit.

FIG. 6 is a diagram illustrating a mechanism in which the input signal $V_{in}$ and periodic noise appear in the output signal $V_{out}$ when jitter is added to a clock signal for causing the digital section to operate in the D/A converter.

Graph (a) of FIG. 6 is a diagram illustrating signals output from the capacitor 111-1 shown in FIG. 1 and shows a spectrum obtained by transforming the input signal $V_{in}$ to a frequency axis by Fourier transform.

Graph (b) of FIG. 6 shows a spectrum obtained by transforming a clock signal for managing the timings at which the capacitor 111-1 holds and discharges the charge accumulated by the input signal $V_{in}$ to the frequency axis by Fourier transform. Graph (c) of FIG. 6 shows a spectrum obtained by transforming the output signal $V_{out}$ to the frequency axis by Fourier transform.

In any of graphs (a), (b), and (c) of FIG. 6, the vertical axis represents the spectral intensity of a signal and the horizontal axis represents the frequency. The position of the vertical axis indicated by an arrow in graphs (a), (b), and (c) represents the frequency reference ("0").

In the related art, jitter is added to the clock signal of the digital section of the D/A converter. According to the related art, as shown in graph (a) of FIG. 6, energy of periodic noise N3 is dispersed in the wider frequency band than before adding the jitter. Accordingly, the peak of the spectrum of the periodic noise N3 is lower than the peak of the spectrum of the periodic noise N2 shown in FIG. 5. The peak of the spectrum of periodic noise N3' generated in the in-band is lowered, similarly to the periodic noise N3. According to this configuration, it is possible to reduce noise generated from the D/A converter itself and thus to reduce an influence of the noise on other devices.

Contrary to the invention described in Patent Document 1, an object of the first aspect is to provide a sampling circuit or the like which can further disperse the peak of the spectrum of the periodic noise N3' shown in FIG. 6 to remove the influence of noise generated from other devices.

In the first aspect, in order to achieve the above-mentioned object, jitter is added to the clock signal of the sampling and holding section of the D/A converter.

Figure 7:
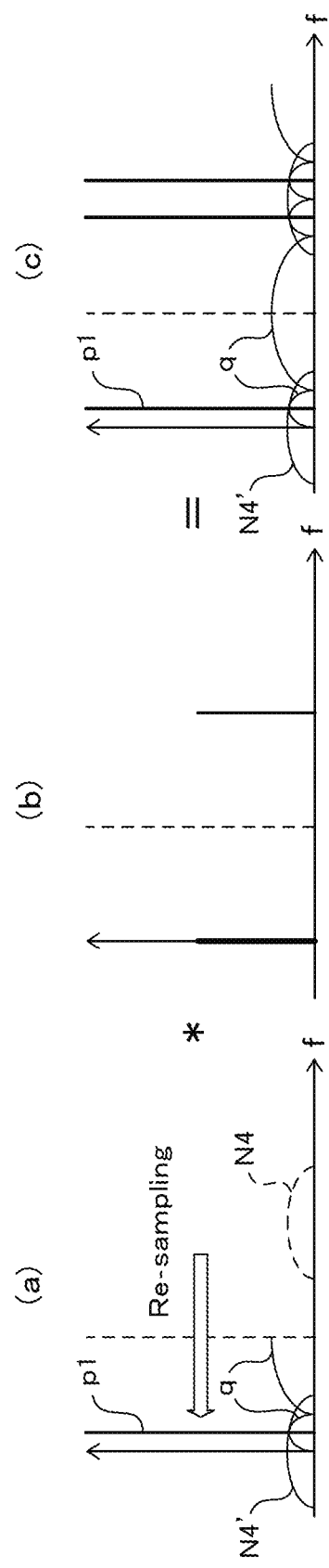
FIGS. 7(a)-(c) are diagrams illustrating periodic noise when the jitter is added to a clock signal of a digital section and a clock signal of a sampling and holding section in a D/A converter including the sampling circuit.

FIG. 7 is a diagram illustrating a mechanism in which the input signal $V_{in}$ and periodic noise appear in the output signal $V_{out}$ when jitter is added to the clock signal of the digital section and the clock signal of the sampling and holding section in the D/A converter.

Graph (a) of FIG. 7 is a diagram illustrating signals output from the capacitor 111-1 shown in FIG. 1 and shows a spectrum obtained by transforming the input signal $V_{in}$ to a frequency axis by Fourier transform.

Graph (b) of FIG. 7 shows a spectrum obtained by transforming a clock signal for managing the timings at which the capacitor 111-1 holds and discharges the charge accumulated by the input signal $V_{in}$ to the frequency axis by Fourier transform. Graph (c) of FIG. 7 shows a spectrum obtained by transforming the output signal $V_{out}$ to the frequency axis by Fourier transform.

In any of graphs (a), (b), and (c), the vertical axis represents the spectral intensity of a signal and the horizontal axis represents the frequency. The position of the vertical axis indicated by an arrow in graphs (a), (b), and (c) represents the frequency reference ("0").

As shown in graph (a), when clock signals having jitter added thereto are supplied to the sampling and holding section as well as the digital section, it is possible to disperse the periodic noise due to inrush current in the analog section. Accordingly, the peak of the spectrum of the periodic noise N4 can be made to be lower than the peak of the spectrum of the periodic noise N3 shown in FIG. 6. Since jitter is added to the operation clocks, modulation is applied during the replication and thus the peak of the spectrum of the periodic noise N4' generated in the in-band is much lower than the peak of the spectrum of the periodic noise N4. As a result, it is apparent that the first aspect can reduce the periodic noise generated in the in-band in comparison with the related art.

According to the first aspect, since a frequency dispersion effect is exhibited in modulation from the periodic noise N4 shown in FIG. 7 to the periodic noise N4', it is possible to reduce the periodic noise generated in the in-band in the D/A converter. The periodic noise is not limited to the periodic noise generated from the D/A converter, but can include, for example, periodic noise from an A/D converter mounted on the same board. Accordingly, by applying the first aspect to electronic components of which the operations are affected by periodic noise, it is possible to reduce periodic noise of the electronic components. The first aspect is advantageous in terms of a decrease in the size and a simplification in configuration of electronic devices.

A concept of the sampling circuit according to the present invention will be described below with reference to an A/D converter employing the sampling circuit according to this embodiment.

Figure 8:
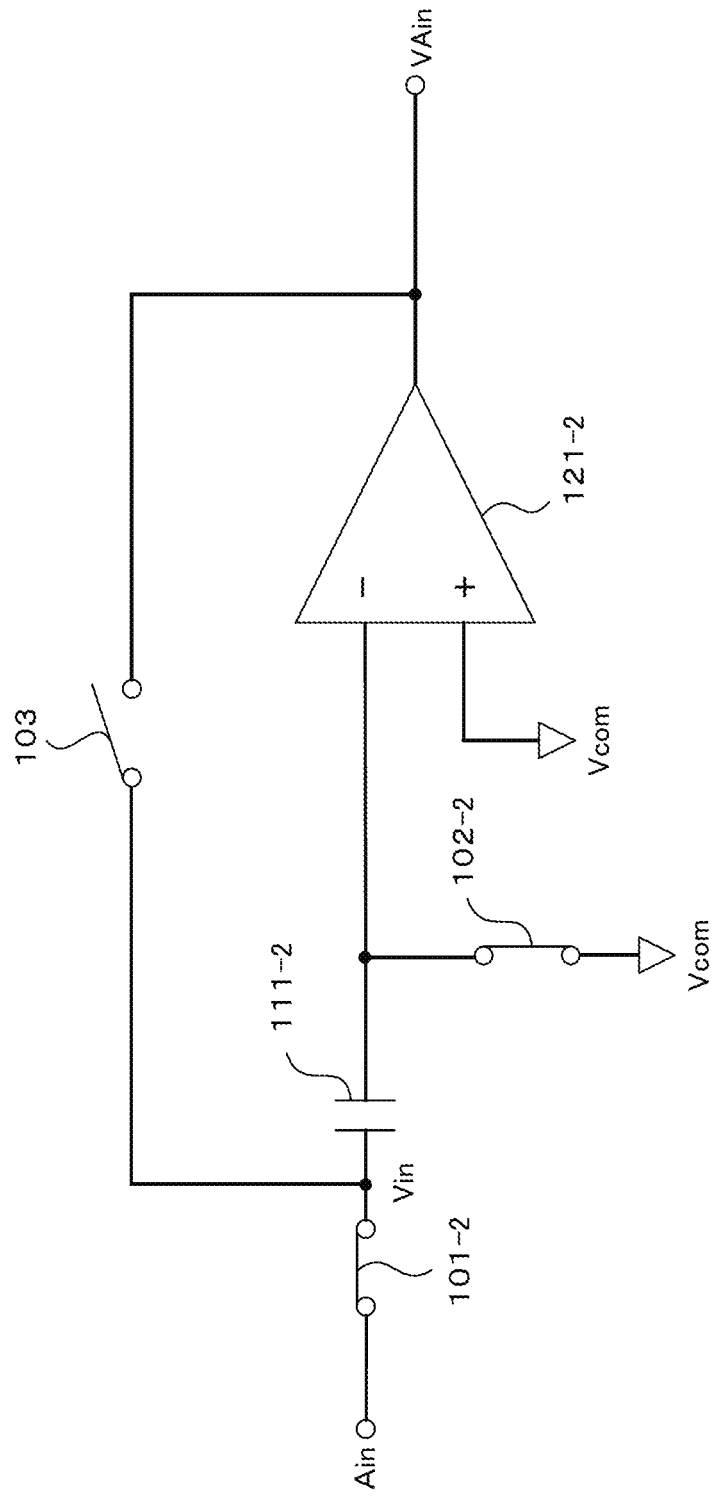
FIG. 8 is a diagram illustrating a sampling circuit according to a second aspect of the present invention.

A sampling circuit shown in FIG. 8 is a sampling circuit according to an aspect (hereinafter, referred to as a "second aspect") serving as a basis of this embodiment.

The sampling circuit includes a continuous section, a sampling and holding section, and a digital section. In this configuration, the digital section includes a general digital circuit and outputs a signal which is quantized and sampled. The sampling and holding section includes a general switched-capacitor circuit (SC circuit) and outputs a signal which is not quantized but sampled. The continuous section includes a general continuous signal circuit (continuous circuit) and outputs a signal which is not quantized and not sampled.

In the sampling circuit shown in FIG. 8, the continuous section receives an analog input signal $A_{in}$. The sampling and holding section intermittently samples the analog input signal $A_{in}$ input to the continuous section and holds and transfers the sampled signal. In FIG. 8, the digital section that handles a digital signal is not shown.

The sampling circuit shown in FIG. 8 includes a capacitor 111-2 and an operational amplifier 121-2. The analog input signal $A_{in}$ (the sampled analog input signal $A_{in}$ is referred to as an input signal $V_{in}$) sampled by switches 101-2 and 102-2 is applied to the capacitor 111-2 and charge is accumulated therein. The charge accumulated in the capacitor 111-2 is input to the inverting input terminal of the operational amplifier 121-2 by switching of the switches 101-2, 102-2, and 103. The operational amplifier 121-2 receives an input of a reference signal $V_{com}$ from the non-inverting input terminal and outputs an analog signal $VA_{in}$.

In the circuit configuration shown in FIG. 8, when periodic noise is superimposed on the reference signal $V_{com}$, the periodic noise appears as an output waveform at a gain of 0 dB. Accordingly, the sensitivity to noise is the highest at a gain of 0 dB. In the second aspect, a case where periodic noise is superimposed on the reference signal $V_{com}$ will be described first.

Figure 9:
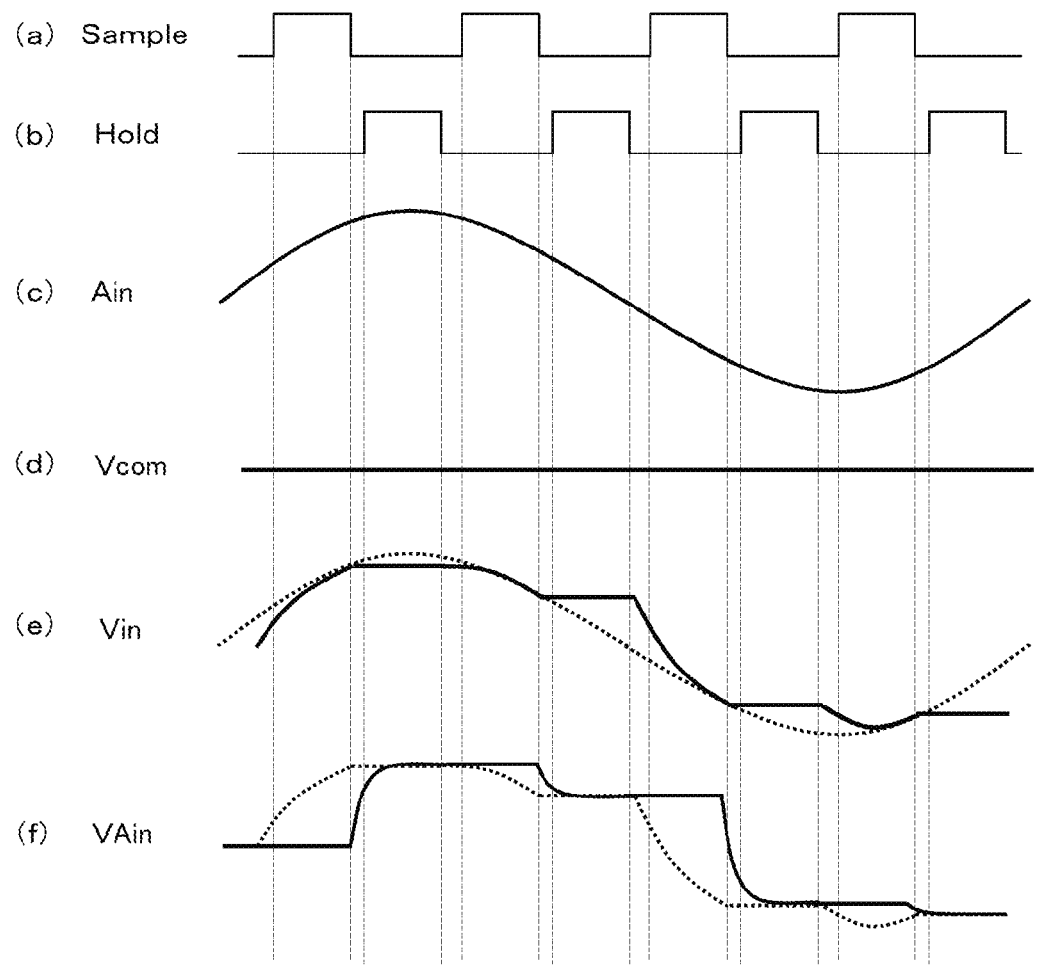
FIGS. 9(a)-(f) are diagrams illustrating an operation of the sampling circuit according to the second aspect of the present invention.

(a) to (f) of FIG. 9 are diagrams illustrating the operation of the sampling circuit according to the second aspect when periodic noise is not present in the reference signal $V_{com}$.

(a) of FIG. 9 shows a sampling timing of the analog input signal $A_{in}$.

(b) of FIG. 9 shows a timing at which the capacitor 111-2 holds and discharge the charge accumulated by the analog input signal $A_{in}$.

The switches supplied with the clock signals shown in (a) and (b) of FIG. 9 are turned on in a section in which the clock signals are at a high level and are turned off in a section in which the clock signals are at a low level.

(c) of FIG. 9 shows the analog input signal $A_{in}$, (d) of FIG. 9 shows the reference signal $V_{com}$ which is a DC voltage, and (e) of FIG. 9 shows an analog signal $V_{in}$ generated by the charge transferred from the capacitor 111-2.

(f) of FIG. 9 shows an output signal $VA_{in}$ which is an analog signal output from the operational amplifier 121-2.

In (e) of FIG. 9, the signal indicated by the dotted line is the analog input signal $A_{in}$. When the analog input signal is sampled, held, and discharged by the switches 101-2, 102-2, and 103, an input signal $V_{in}$ is generated. In (f) of FIG. 9, the signal indicated by the dotted line is an analog signal $V_{in}$ generated by the charge transferred from the capacitors 111-2 and an output signal $VA_{in}$ indicated by the solid line is generated by feedback through the switch 103.

Figure 10:
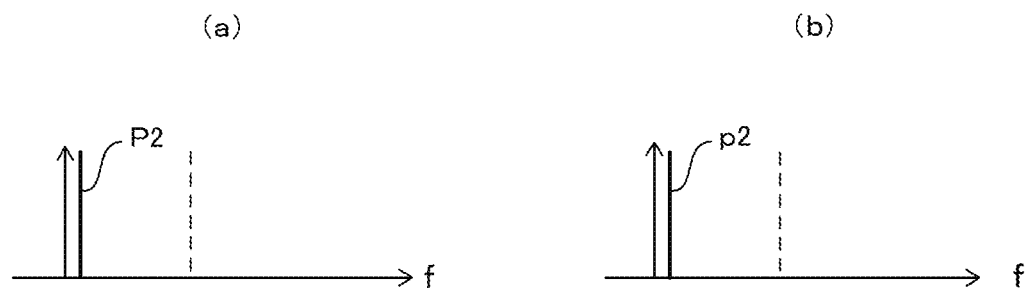
FIGS. 10(a)-(b) are diagrams illustrating signals when the sampling circuit performs the operation shown in FIG. 9.

Graph (a) of FIG. 10 is a diagram illustrating signals output from the capacitor 111-2 shown in FIG. 8 and shows a spectrum obtained by transforming the analog signal $V_{in}$ to the frequency axis by Fourier transform.

Graph (b) of FIG. 10 shows a spectrum obtained by transforming the output signal $VA_{in}$ of the operational amplifier 121-2 to the frequency axis by Fourier transform.

In any of graphs (a) and (b) of FIG. 10, the vertical axis represents the spectral intensity of a signal and the horizontal axis represents the frequency. The position of the vertical axis indicated by an arrow in graphs (a) and (b) of FIG. 10 represents the frequency reference ("0").

As shown in (a) of FIG. 10, the signal (indicated by a spectrum P2 in the drawing) output from the capacitor 111-2 has a constant frequency. When the spectrum p2 is sampled, held, and discharged by the switches 101-2, 102-2, and 103, the output signal $VA_{in}$ (indicated by the spectrum P2 in the drawing) shown in (b) of FIG. 10 is generated.

A case where periodic noise is present in the reference signal $V_{com}$ will be described below.

Figure 11:
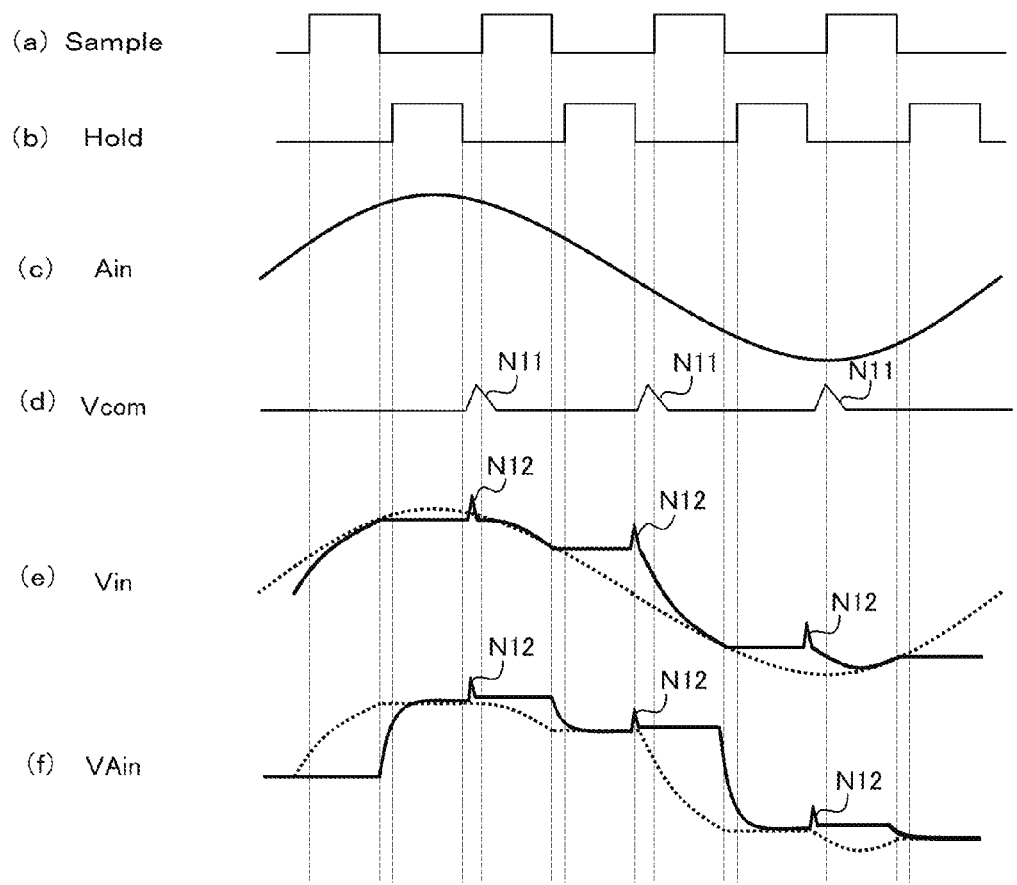
FIGS. 11 (a)-(f) are diagrams illustrating the operation of the sampling circuit according to the second aspect of the present invention.

(a) to (f) of FIG. 11 are diagrams illustrating the operation of the sampling circuit shown in FIG. 8 when periodic noise is present in the reference signal $V_{com}$.

(a) of FIG. 11 shows a sampling timing of the analog input signal $A_{in}$.

(b) of FIG. 11 shows a timing at which the capacitor 111-2 holds and discharge the charge accumulated by the analog input signal $A_{in}$.

(c) of FIG. 11 shows the analog input signal $A_{in}$, (d) of FIG. 11 shows the reference signal $V_{com}$ which is a DC voltage, and (e) of FIG. 11 shows an analog signal $V_{in}$ generated by the charge transferred from the capacitor 111-2.

(f) of FIG. 11 shows an output signal $VA_{in}$ which is an analog signal output from the operational amplifier 121-2.

When periodic noise N11 shown in (d) of FIG. 11 is present in the reference signal $V_{com}$, the periodic noise N11 is superimposed on the output signal $V_{in}$ through the operational amplifier 121-2 in the sampling circuit. Accordingly, when the output signal $V_{in}$ including the periodic noise is sampled and held, periodic noise N12 corresponding to the periodic noise N11 appears in the output signal $VA_{in}$.

The periodic noise shown in (d), (e), and (f) of FIG. 11 will be described below with reference to graphs (a) and (b) of FIG. 12.

Figure 12:
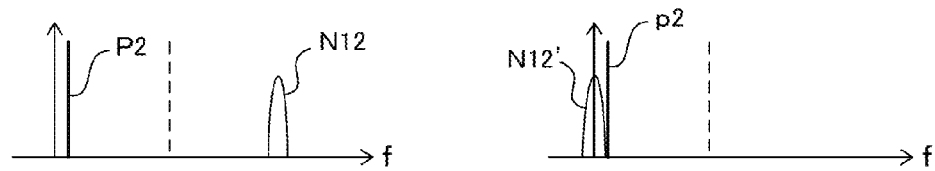
FIGS. 12(a)-(b) are diagrams illustrating periodic noise generated when the sampling circuit shown in FIG. 8 performs an operation.

Graph (a) of FIG. 12 is a diagram illustrating signals output from the capacitor 111-2 shown in FIG. 8 and shows a spectrum P2 obtained by transforming the analog signal $V_{in}$ to the frequency axis by Fourier transform.

Graph (b) of FIG. 12 shows a spectrum p2 obtained by transforming the output signal $VA_{in}$ of the operational amplifier 121-2 to the frequency axis by Fourier transform.

In any of graphs (a) and (b) of FIG. 12, the vertical axis represents the spectral intensity of a signal and the horizontal axis represents the frequency. The position of the vertical axis indicated by an arrow in graphs (a) and (b) of FIG. 12 represents the frequency reference ("0").

When the spectrum shown in graph (a) of FIG. 12 is sampled, held, and discharged by the switches 101-2, 102-2, and 103 shown in FIG. 8, periodic noise N12 is replicated and periodic noise N12' appears near the DC as shown in (b) of FIG. 12. The periodic noise N12' appears in the frequency band used for an output audio, that is, an in-band, when the A/D converter is used, for example, in an audio device.

The second aspect has been made on the basis of a technical thought that periodic noise appearing in the in-band due to a signal output from another device is dispersed to prevent signal quality of an output signal such as an audio from being damaged, by adding jitter to a clock signal causing a device such as a sampling circuit to operate.

In order to clearly understand differences between the second aspect and the related art, the related art described in Patent Document 1 will be described below.

An A/D converter includes a sampling circuit having a continuous section, a sampling and holding section (S/H section), and a digital section. Here, it is assumed that the sampling circuit shown in FIG. 8 is included in the A/D converter.

Graphs (a) and (b) of FIG. 13 are diagrams illustrating periodic noise when jitter is added to a clock signal for causing the digital section to operate in the A/D converter.

Graph (a) of FIG. 13 is a diagram illustrating signals output from the capacitor 111-2 shown in FIG. 8 and shows a spectrum P2 obtained by transforming the analog signal $V_{in}$ to a frequency axis by Fourier transform.

Graph (b) of FIG. 13 shows a spectrum p2 obtained by transforming the output signal $VA_{in}$ of the operational amplifier 121-2 to the frequency axis by Fourier transform.

In any of graphs (a) and (b) of FIG. 13, the vertical axis represents the spectral intensity of a signal and the horizontal axis represents the frequency. The position of the vertical axis indicated by an arrow in graphs (a) and (b) of FIG. 13 represents the frequency reference ("0").

In the related art, jitter is added to the clock signal of the digital section of the A/D converter. According to the related art, as shown in graph (a) of FIG. 13, energy of periodic noise N13 is dispersed in the wider frequency band than before adding the jitter. Accordingly, the peak of the spectrum of the periodic noise N13 is lower than the peak of the spectrum of the periodic noise N12 shown in FIG. 12. The peak of the spectrum of periodic noise N13' generated in the in-band is lowered, similarly to the periodic noise N13. According to this configuration, it is possible to reduce noise generated from the A/D converter itself and thus to reduce an influence of the noise on other devices.

Contrary to the invention described in Patent Document 1, an object of the second aspect is to provide a sampling circuit or the like which can further disperse the peak of the spectrum of the periodic noise N13' shown in FIG. 13 to remove the influence of noise generated from other devices.

In the second aspect, in order to achieve the above-mentioned object, jitter is added to the clock signal of the sampling and holding section of the A/D converter.

Graphs (a) and (b) of FIG. 14 are diagrams illustrating periodic noise when jitter is added to the clock signal of the digital section and the clock signal of the sampling and holding section in the A/D converter.

Graph (a) of FIG. 14 is a diagram illustrating signals output from the capacitor 111-2 shown in FIG. 8 and shows a spectrum P2 obtained by transforming the analog signal $V_{in}$ to a frequency axis by Fourier transform.

Graph (b) of FIG. 14 shows a spectrum p2 obtained by transforming the output signal $VA_{in}$ of the operational amplifier 121-2 to the frequency axis by Fourier transform.

In any of graphs (a) and (b) of FIG. 14, the vertical axis represents the spectral intensity of a signal and the horizontal axis represents the frequency. The position of the vertical axis indicated by an arrow in graphs (a) and (b) of FIG. 14 represents the frequency reference ("0").

As shown in graph (a) of FIG. 14, when clock signals having jitter added thereto are supplied to the sampling and holding section as well as the digital section, it is possible to disperse the periodic noise due to inrush current in the analog section. Accordingly, the peak of the spectrum of the periodic noise N14 can be made to be lower than the peak of the spectrum of the periodic noise N13 shown in FIG. 13. Since the jitter is added to the operation clocks, modulation is applied during the replication and thus the peak of the spectrum of the periodic noise N14' is much lower than the peak of the spectrum of the periodic noise N14. As a result, it is apparent that the second aspect can reduce the periodic noise generated in the in-band in comparison with the related art.

According to the second aspect, since a frequency dispersion effect is exhibited in modulation from the periodic noise N14 shown in FIG. 14 to the periodic noise N14', it is possible to reduce the periodic noise generated in the in-band in the A/D converter. The periodic noise is not limited to the periodic noise generated from the A/D converter, but by applying the second aspect to electronic components of which the operations are affected by periodic noise, it is possible to reduce periodic noise of the electronic components. The second aspect is advantageous in terms of a decrease in the size and a simplification in configuration of electronic devices.

Embodiment 1, Embodiment 2, and Embodiment 3 of the present invention based on the above-mentioned thought will be described below.

First, an A/D converter according to Embodiment 1 employing the sampling circuit according to the present invention will be described. In Embodiment 1, an example where the A/D converter is constructed as a pipelined A/D converter will be described.

FIG. 15 is a diagram illustrating a pipelined A/D converter according to Embodiment 1.

The pipelined A/D converter according to Embodiment 1 is a converter that converts an analog input signal $A_{in}$ into a digital output signal $D_{out}$ of N bits. Accordingly, the pipeline type A/D converter includes a sampling circuit (which is described as S/H in the drawing) 801 that samples and holds the analog input signal $A_{in}$, k stages (which is described as S in the drawing) S1, S2, . . . , Sk that are connected in series to determine each bit, a memory 803 that stores an n-digit digital output signal dj (where j is an integer of 1 to k) determined in each stage, and a operational circuit 804 that calculates the digital output signal $D_{out}$ which is the A/D converted value of the analog input signal $A_{in}$ on the basis of the digital output signals dj stored in the memory 803.

In Embodiment 1, it is assumed that the A/D converter includes a control circuit 139 that controls plural stages. The control circuit 139 outputs at least one of a clock signal $\phi 1$ not having jitter added thereto and representing an operation clock, a clock signal $\phi 2$, which is a reverse-phased and non-overlapping clock which is not changed to the high level at the same time as the clock signal $\phi 1$, not having jitter added thereto, clock signals $\phi 1'$ and $\phi''$ obtained by adding jitter to the clock signal $\phi 1$, and a clock signal $\phi 2'$ obtained by adding the jitter to the clock signal $\phi 2$ to the stages.

The sampling circuit 801 is a circuit that outputs a value, which is obtained by sampling and holding an analog input signal $A_{in}$, as the analog input signal $VA_{in}$ to the first stage S1. The sampling circuit 801 employs a non-feedback sampling circuit including analog switches and capacitors.

The stages S1 to Sk are connected in series and transmit n-digit digital output signals dj to the memory 803 on the basis of the input signal $VA_{in}$. In each stage, the input signal $VA_{in}$ is input from the front stage, and an analog output signal $VA_{out}$ generated by the digital output signal dj and the input signal $VA_{in}$ is output to the next stage. In the drawing, the input signal $VA_{in}$ and the output signal $VA_{out}$ based on the stage S1 are shown.

The memory 803 receives and stores the n-digit digital output signals dj from the k stages S1 to Sk. Accordingly, a semiconductor memory capable of storing at least k n-bit addresses or the like is used as the memory 803.

The operational circuit 804 performs a calculation on the basis of the digital output signal dj stored in the memory 803 and outputs the N-digit digital output signal $D_{out}$. The calculation for calculating the digital output signal $D_{out}$ is performed as follows.

That is, the operational circuit 804 adds the highest significant digit of the digital output dk of the stage Sk and the lowest significant digit of the digital output d(k−1) of the stage S(k−1) by a binary method. On the addition result (sum value), the highest significant digit of d(k−1) and the lowest significant digit of the digital output d(k−2) of the stage S(k−2) are similarly added by a binary method.

By repeating this process, the lowest significant digit of the digital output d1 of the stage S1 and the highest significant digit of the digital output d2 of the stage S2 are added. The final addition result is output as the digital output signal $D_{out}$.

Figure 16:
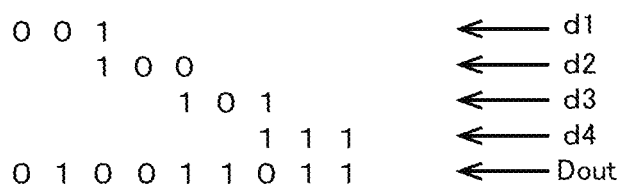
FIG. 16 is a diagram illustrating an operation of calculating a digital output signal in the pipelined A/D converter.

FIG. 16 is a diagram illustrating an example of the calculation of calculating the above-mentioned digital output signal $D_{out}$.

In the example shown in FIG. 16, it is assumed that four stages S1 to S4 are provided and the respective stages S1 to S4 output the three-digit digital outputs d1 to d4 to the memory 803 shown in FIG. 15. More specifically, the values of the digital outputs d1 to d4 are determined as follows.

d1=001, d2=100, d3=101, d4=111

In the example of FIG. 16, the value "010011011" is obtained as the digital output signal $D_{out}$ as the addition result of the highest significant digit and the lowest significant digit of the digital outputs output from the neighboring stages.

Embodiment 1-1 and Embodiment 1-2 will be described below as specific examples of the sampling circuit according to Embodiment 1. Embodiment 1-1 provides a sampling circuit using the clock signals φ1 and φ2 not having jitter added thereto and the clock signals φ1' and φ2' having jitter added thereto as clock signals. Embodiment 1-2 provides a sampling circuit using the clock signal φ1" having jitter added to only the rising portion of the clock signal φ1 in addition to the clock signals φ1, φ2, φ1', and φ2'. The basic configuration of the sampling circuit is the same in Embodiment 1-1 and Embodiment 1-2.

Figure 17:
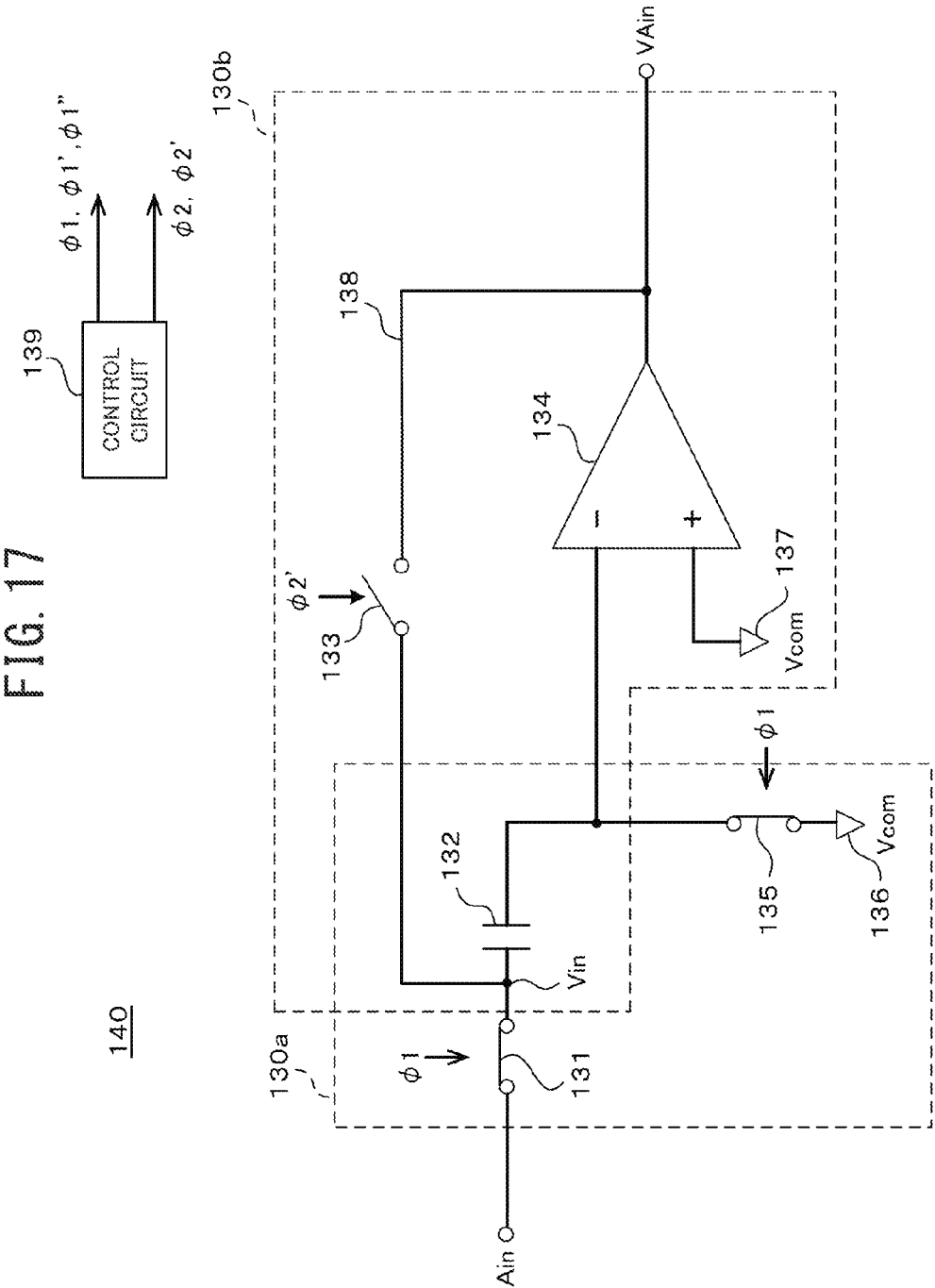
FIG. 17 is a diagram illustrating a sampling circuit according to Embodiment 1-1.

FIG. 17 is a diagram illustrating the sampling circuit according to Embodiment 1-1 and shows both the sampling circuit 801 shown in FIG. 15 and the control circuit 139 common to plural A/D converters.

The sampling circuit 140 (corresponding to the sampling circuit 801 shown in FIG. 15) shown in FIG. 17 includes a continuous section 130a that receives the analog input signal $A_{in}$ and a sampling and holding section 130b that intermittently samples the analog input signal $A_{in}$ input from the continuous section 130a and that holds and transfers the sampled signal. In Embodiment 1, the memory 803 and the operational circuit 804 shown in FIG. 15 serve as the digital section 130c shown in FIG. 18 and described later.

The control circuit 139 common to the stages of the pipelined A/D converter generates the clock signals φ1 and φ2 not having jitter added thereto, the clock signals φ1' and φ2' having the jitter added thereto, and the clock signal φ1" having the jitter added to only the rising edge of the clock signal φ1. Out of the clock signals, the clock signal φ1 is input to the continuous section 130a and the clock signal φ2' is input to the sampling and holding section 130b.

The continuous section 130a includes a switch 131 and a switch 135. The switches 131 and 135 are turned on and off in response to the clock signal φ1. By the ON and OFF operations of the switches 131 and 135, the analog input signal $A_{in}$ is sampled and becomes the input signal $V_{in}$.

The sampling and holding section 130b includes a capacitor 132 that samples the input signal $V_{in}$ and that holds the charge generated by the input signal $V_{in}$ and a switch 133 that transfers the charge held in the capacitor 132 to the following stage. The switch 133 performs its switching operation in response to the clock signal φ2'.

In Embodiment 1-1, the continuous section 130a is configured to operate in response to the clock signal φ1 and the sampling and holding section 130b is configured to operate in response to the clock signal φ2' having the jitter added thereto. Embodiment 1-1 is not limited to this configuration, but, for example, the switch 131 and the switch 135 may be configured to operate in response to different clock signals or may be configured to operate in response to a clock signal having the jitter added thereto. In this case, the jitter should not be added to a clock signal for causing a switch, which is first turned off, to operate. That is, when the switch 135 is first turned off and the switch 131 is then turned off, the clock signal φ1 not having jitter added thereto may be used as the clock for causing the switch 135 to operate and the clock signal φ1' having the jitter added thereto may be used as the clock for causing the switch 131 to operate.

Figure 18:
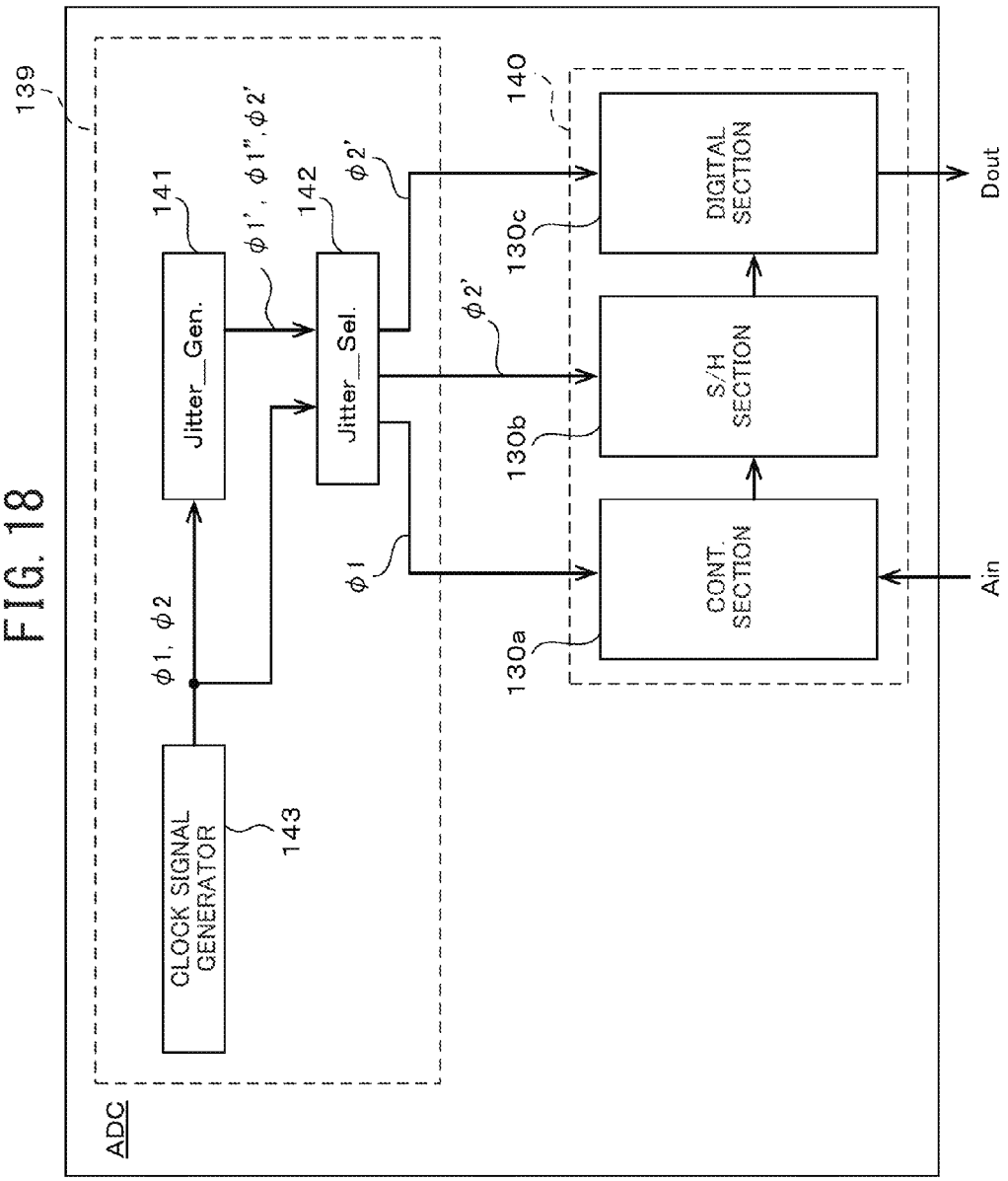
FIG. 18 is a functional block diagram illustrating an A/D converter including a sampling circuit and a control circuit according to Embodiment 1-1.

FIG. 18 is a functional block diagram illustrating an A/D converter (described as ADC in the drawing) including the sampling circuit 140 and the control circuit 139 shown in FIG. 17.

The control circuit 139 supplies the clock signal φ1 not having the jitter added thereto to the continuous section 130a, supplies the clock signal φ2' having the jitter added thereto to the digital section 130c, and supplies the clock signal φ2' having the jitter added thereto to the sampling and holding section 130b. The clock supplied to the digital section 130c may be the clock signal φ1' which has a reversed phase with respect to the clock supplied to the sampling and holding section 130b.

That is, the control circuit 139 includes a clock signal generator 143, a jitter generator (described as Jitter_Gen. in FIG. 18) 141, and a jitter selector (indicated by Jitter_Sel. in FIG. 18) 142. The clock signal generator 143 generates a clock signal φ1 and a reverse-phased and non-overlapping clock signal φ2 which is not changed to a high level at the same as the clock signal φ1. The jitter generator 141 adds the jitter to the clock signal φ1 to generate a clock signal φ1' and adds the jitter to the clock signal φ2 to generate a reverse-phased and non-overlapping clock signal φ2' which is not changed to a high level at the same time as the clock signal φ1' and which has the jitter added thereto. The jitter generator adds the jitter to only the rising edge of the clock signal φ1 to generate a clock signal φ1". The clock signal φ1" is an reverse-phased clock signal which is not changed to a high level at the same time as the clock signals φ2 and φ2'. The clock signal φ1, the clock signals φ1' and φ1" generated by adding the jitter to the clock signal φ1, and the clock signals φ2 and φ2' have a reverse-phased and non-overlapping relationship in which they are not changed to a high level at the same time.

The jitter generator 141 operates to output the generated clock signal φ2' having the jitter added thereto to the sampling and holding section 130b, to output the generated clock signal φ1 not having the jitter added thereto to the continuous section 130a, and to output the generated clock signal φ2' having the jitter added thereto to the digital section 130c. The jitter generator 141 can be constructed relatively simply by a delay circuit delaying a clock signal or the like.

The clock signals φ1, φ2, φ1', φ2', and φ1" generated by the control circuit 139 will be specifically described below.

Figure 19:
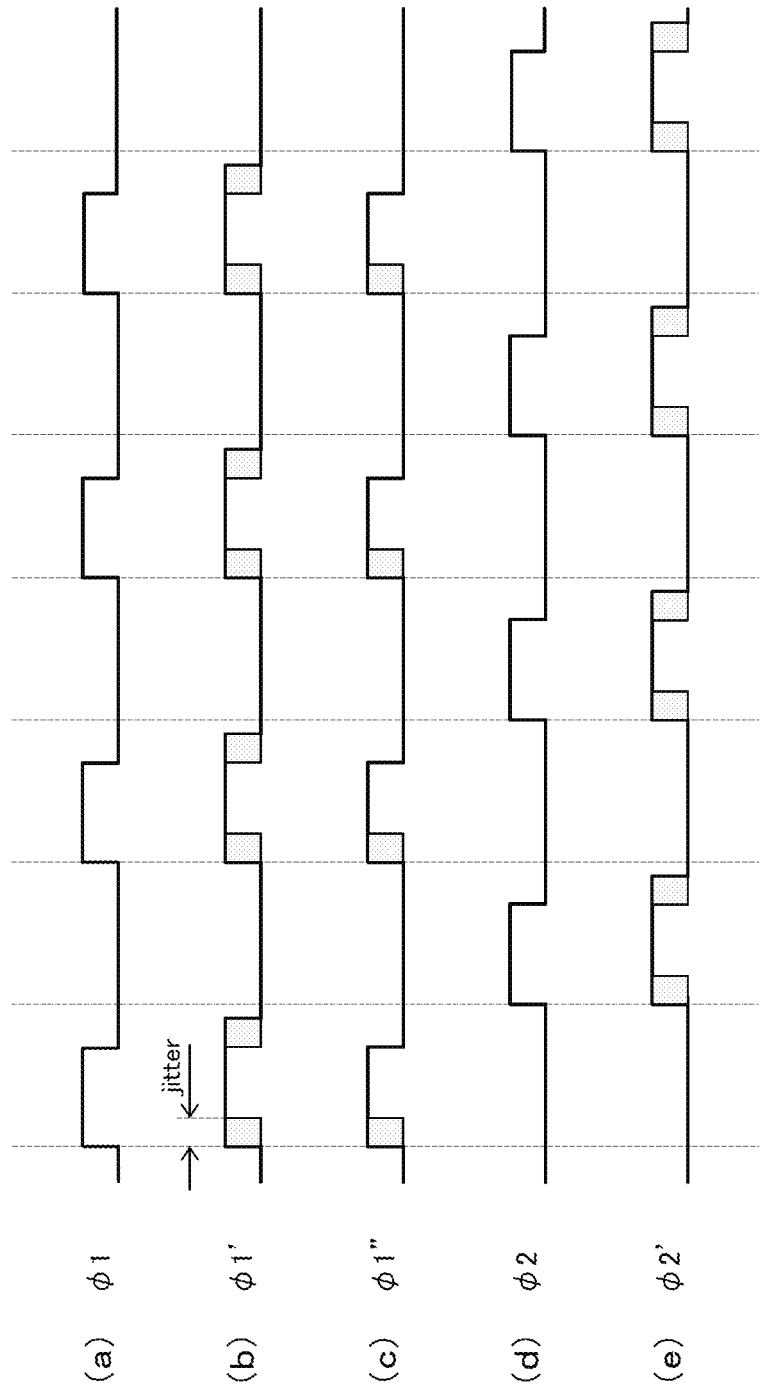
FIGS. 19(a)-(e) are diagrams illustrating timing charts of clock signals φ1, φ1', φ1", φ2, and φ2'.

(a) to (e) of FIG. 19 are diagrams illustrating timing charts of the clock signals φ1, φ1', φ2, φ2', and φ1".

In FIG. 19, (a) shows a timing chart of the clock signal φ1, (b) shows a timing chart of the clock signal φ1', (c) shows a timing chart of the clock signal φ1", (d) shows a timing chart of the clock signal φ2, and (e) shows a timing chart of the clock signal φ2'.

The switches supplied with the clock signals are driven so that the switches are turned on in a section in which the clock signals are at the high level and the switches are turned off in a section in which the clock signals are at the low level.

The clock signal φ1" having the jitter added to only the rising portion of the clock signal is generated by inputting the clock signal φ1 and the clock signal φ1' to an AND circuit.

Figure 20:
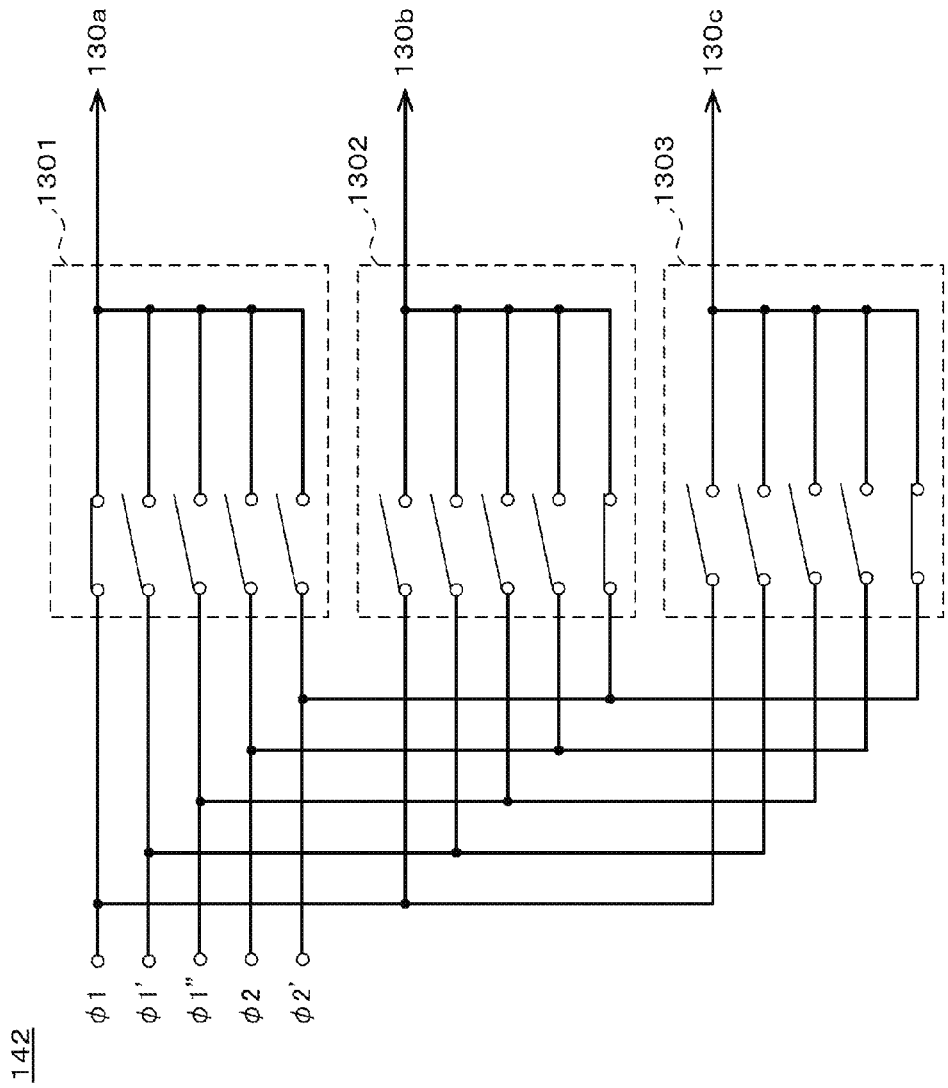
FIG. 20 is a diagram illustrating a specific configuration of a jitter selector.

FIG. 20 is a diagram illustrating a specific configuration of the jitter selector 142 shown in FIG. 18.

As shown in FIG. 20, the jitter selector 142 includes switch sections 1301, 1302, and 1303 each having five switches. The switch section 1301 selects a clock signal to be output to the continuous section 130a. The switch section 1302 selects a clock signal to be output to the sampling and holding section 130b. The switch section 1303 selects a clock signal to be output to the digital section 130c.

The clock signals φ1' and φ2' having the jitter added thereto are input to the jitter selector 142. At this time, the clock signals φ1 and φ2 not having the jitter added thereto are also input to the jitter selector 142.

The jitter selector 142 selects the clock signal φ1 out of the clock signals φ1, φ2, φ1', φ2', and φ1" and outputs the selected clock signal to the continuous section 130a. The jitter selector selects and outputs the clock signal φ2' to the sampling and holding section 130b, and selects and outputs the clock signal φ2' to the digital section 130c.

The jitter selector 142 may be removed from the configuration shown in FIG. 18, the clock signal φ1 may be directly output from the clock signal generator 143 to the continuous section 130a, and the clock signal φ2' may be directly output from the jitter generator 141 to the sampling and holding section 130b and the digital section 130c.

According to Embodiment 1-1, since the sampling and holding section 130b transmits a sampled signal and the signal component thereof is a DC component, the signal component is not modulated by the jitter added to the operation clock. However, since periodic noise generated from the A/D converter itself or mixed from other electronic devices is an AC component, the noise component is modulated by the jitter added to the operation clock and thus the noise dispersion effect is achieved. In other words, only an NTF (Noise Transfer Function) is modulated by the jitter without any change in an STF (Signal Transfer Function), and it is thus possible to efficiently separate the mixed periodic noise from the signal component. Therefore, the jitter generator can be said to be a frequency-modulating signal generator that generates a signal for modulating a frequency. The jitter can be said to be a signal of which the frequency varies.

Accordingly, without adding noise to a signal to be transmitted, it is possible to disperse only the noise in the in-band and thus to reduce the peak of the spectrum thereof.

According to Embodiment 1-1, it is possible to enhance the resistance to noise of the A/D converter itself, instead of reducing noise generated from devices around the A/D converter. Accordingly, it is possible to reduce the influence of noise on the A/D converter only by changing the A/D converter without changing the configurations of the other devices around the A/D converter.

Embodiment 1-1 can be embodied by only adding a circuit for adding the jitter to a clock signal. Accordingly, advanced semiconductor process technology or an increase in the number of pins of a chip is not necessary and it is thus possible to prevent an increase in cost of the A/D converter. According to Embodiment 1-1, since the A/D converter can be disposed sufficiently close to other devices without considering of the influence of noise, it is possible to reduce the size of an apparatus including the A/D converter.

In Embodiment 1-1, it is possible to reduce noise suppressing requests to a decoupling capacitor which is generally installed for the purpose of reducing noise generated from devices around the A/D converter. According to Embodiment 1-1, since the noise suppressing requests to the decoupling capacitor can be reduced, it may be possible to make the decoupling capacitor itself unnecessary.

In Embodiment 1-1, the digital section 130c is configured to operate in response to the clock signal φ2' having the jitter added thereto. However, Embodiment 1-1 is not limited to this configuration, but the effect of enhancing the resistance of the A/D converter itself to noise is not damaged at all even when the clock signal φ2 not having the jitter added thereto is input to the digital section 130c. By adding the jitter to the clock signal of the digital section 130c, it is possible to reduce a peak of noise in the signal output from the A/D converter and thus to reduce the influence of noise from the A/D converter on the other devices.

In Embodiment 1-1, when the A/D converter is used as a simple device, the control circuit 139 shown in FIG. 15 is provided to correspond to a single sampling circuit. In Embodiment 1-1, the clock signal generator 143 of the A/D converter may be disposed outside the A/D converter. In Embodiment 1-1, when the sampling circuit of the A/D converter shown in FIGS. 17 and 18 is constructed as an independent device, the control circuit 139 may be disposed outside the device.

A sampling circuit according to Embodiment 1-2 of the present invention and an A/D converter using the sampling circuit will be described below.

Embodiment 1-2 is different from Embodiment 1-1, in that a clock signal φ1" having the jitter added thereto is also input to the continuous section so as to disperse radiation noise due to inrush current generated in the continuous section. By adding the jitter to an edge which is a trigger for determining an operation start time of a clock signal to be input to the continuous section and not adding the jitter to an edge which is a trigger for determining an operation end time, it is possible to disperse the radiation noise due to inrush current in an analog section and to further effectively suppress the radiation noise.

Figure 21:
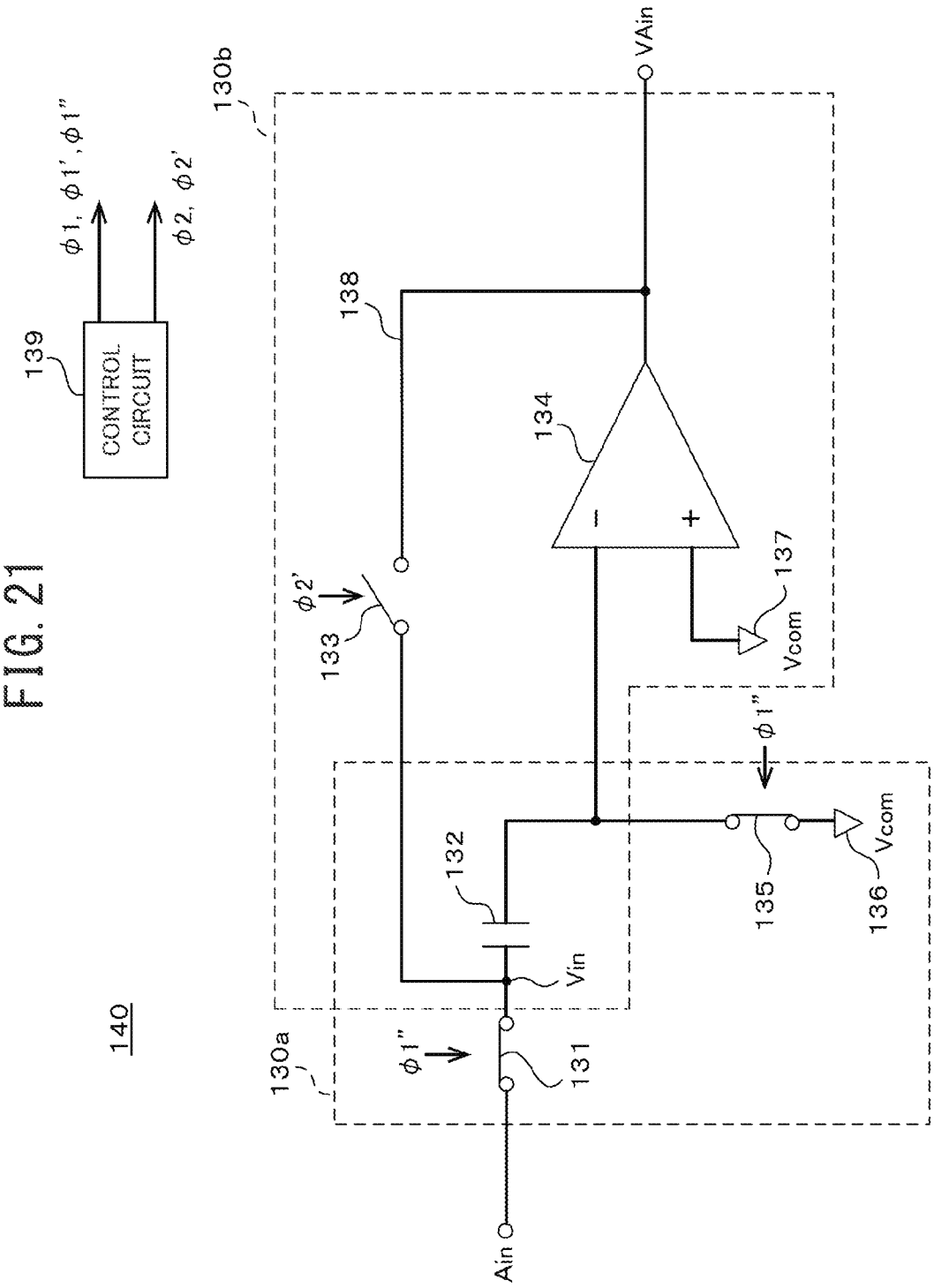
FIG. 21 is a diagram illustrating a sampling circuit according to Embodiment 1-2.

FIG. 21 is a diagram illustrating the sampling circuit according to Embodiment 1-2 and shows both the sampling circuit 801 shown in FIG. 15 and the control circuit 139 common to plural A/D converters.

Similarly to the sampling circuit 140 according to embodiment 1-1, the sampling circuit 140 according to Embodiment 1-2 shown in FIG. 21 includes a continuous section 130a that receives the analog input signal $A_{in}$ and a sampling and holding section 130b that intermittently samples the analog input signal $A_{in}$ input from the continuous section 130a and that holds and transfers the sampled signal. In Embodiment 1-2, the memory 803 and the operational circuit 804 shown in FIG. 15 serve as the digital section 130c shown in FIG. 22 described later.

The control circuit 139 generates and outputs a clock signal φ1' having the jitter added to the rising and falling edges of the clock signal φ1, a clock signal φ1" having the jitter added to the rising edge of the clock signal φ1 and not having the jitter added to the falling edge, and a clock signal φ2' having the jitter added to the rising and falling edges of the non-overlap clock signal φ2 which is not changed to a high level at the same time as the clock signal φ1.

The control circuit 139 supplies the continuous section 130a with the clock signal φ1" having the jitter added to the rising edge and not having the jitter added to the falling edge out of the clock signals, supplies the digital section 130c with the clock signal φ2' having the jitter added thereto, and supplies the sampling and holding section 130b with the clock signal φ2' having the jitter added thereto. In Embodiment 1-2, any clock signal can be supplied to the digital section 130c and for example, the clock signal φ1' having a reverse-phased relationship with respect to the clock signal supplied to the sampling and holding section 130b is supplied.

The continuous section 130a includes a switch 131 and a switch 135 which are turned on and off in response to the clock signal φ1″. The analog input signal $A_{in}$ becomes an input signal $V_{in}$ by the on and off operations of the switch 131 and the switch 135.

The sampling and holding section 130b includes a capacitor 132 that samples the input signal $V_{in}$ and holds charge generated by the input signal $V_{in}$ and a switch 133 that transfers the charge held by the capacitor 132 to a rear stage. The switch 133 performs its switching operation in response to the clock signal φ2′.

In Embodiment 1-2, the continuous section 130a is configured to operate in response to the clock signal φ1″ and the sampling and holding section 130b is configured to operate in response to the clock signal φ2′. Embodiment 1-2 is not limited to this configuration, but for example, the switch 131 and the switch 135 may be configured to operate in response to different clock signals and may be configured to operate in response to a clock signal having the jitter added thereto. In this case, the jitter should not be added to a clock signal for causing a switch, which is first turned off, to operate. That is, when the switch 135 is first turned off and the switch 131 is then turned off, the clock signal φ1″ having the jitter added to the rising edge and not having the jitter added to the falling edge may be used as the clock for causing the switch 135 to operate, and the clock signal φ1′ having the jitter added thereto may be used as the clock for causing the switch 131 to operate.

Figure 22:
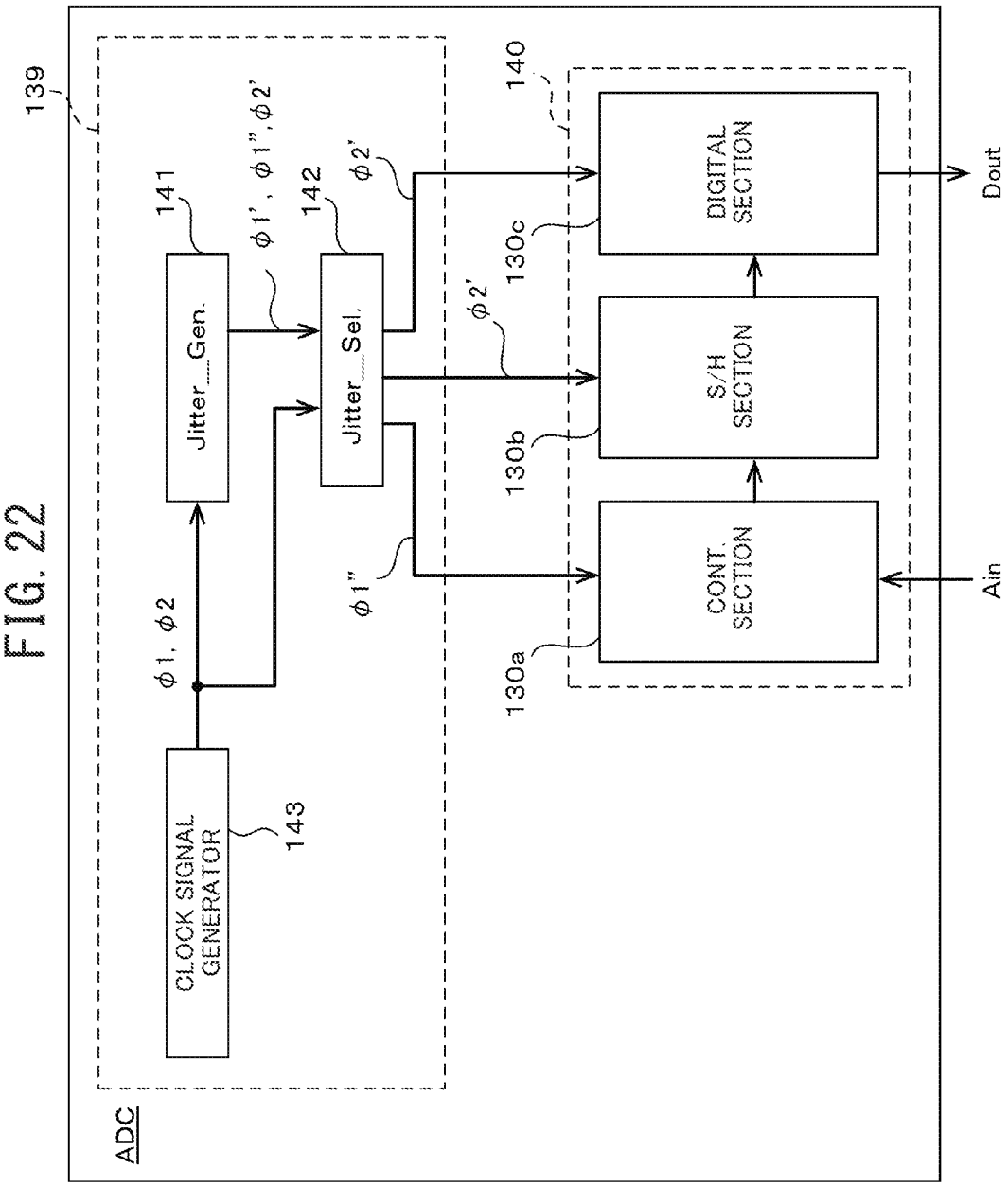
FIG. 22 is a functional block diagram illustrating an A/D converter including a sampling circuit and a control circuit according to Embodiment 1-2.

FIG. 22 is a functional block diagram illustrating an A/D converter (described as ADC in the drawing) including the sampling circuit 140 and the control circuit 139 shown in FIG. 21.

The control circuit 139 includes a clock signal generator 143, the jitter generator (described as Jitter_Gen. in FIG. 22) 141, and a jitter selector (indicated by Jitter_Sel. in FIG. 22) 142. The clock signal generator 143 generates clock signals φ1 and φ2 not having the jitter added thereto. The jitter generator 141 generates clock signals φ1′ and φ2′ having the jitter added to the clock signals φ1 and φ2 and a clock signal φ1″ having the jitter added to the rising edge which is a trigger for determining an operation start time of the clock signal φ1 and not having the jitter added to the falling edge which is a trigger for determining an operation end time. The jitter selector 142 receives the clock signals φ1, φ2, φ1′, φ2′, and φ1″, and operates to select and output the clock signal φ2′ generated by the jitter generator 141 to the sampling and holding section 130b and the digital section 130c, and to select and output the clock signal φ1″ to the continuous section 130a.

As can be clearly seen from (a) to (e) of FIG. 19, the clock signals φ1′ and φ2′ of the clock signals φ1, φ2, φ1′, φ2′, and φ1″ have the jitter added to the rising and falling edges of the clock signals. However, the clock signal φ1″ has the jitter added to only the rising edge of the clock signal.

In the continuous section 130a in Embodiment 1-2, the variation of the operation end time at which an analog input signal is sampled and held as $A_{in}$ causes frequency modulation in a signal component. However, in Embodiment 1-2, the jitter does not affect the operation end time of sampling and holding the analog input signal as $A_{in}$ by causing the switches 131 and 135 of the continuous section 130a to operate in response to the clock signal φ1″. Accordingly, the clock signal φ1″ does not modulate the signal component of the analog input signal $A_{in}$. Since the timing for determining the operation start time of the clock signal φ1″ is dispersed by the jitter, the radiation noise due to inrush current generated at that time can be dispersed.

In this configuration, the jitter selector 142 in Embodiment 1-2 selects and supplies the clock signal φ2′ to the sampling and holding section 130b and the digital section 130c shown in FIG. 22. The clock signal φ1″ is supplied to the continuous section 130a shown in FIG. 22.

According to this configuration, since the signal component in the sampling and holding operation of the continuous section 130a is an AC component, the signal component is not modulated by not adding the jitter to the edge which is a trigger for determining the operation end time of the operation clock signal. On the other hand, by adding the jitter to the edge which is a trigger for determining an operation start time, it is possible to disperse the radiation noise due to inrush current generated at the time of starting the sampling and holding operation of the continuous section and to further effectively suppress the radiation noise.

According to Embodiment 1-2, it is possible to reduce noise generated from the A/D converter itself to enhance resistance to noise of the A/D converter itself and it is possible to disperse radiation noise due to inrush current generated in the continuous section to further reduce noise. Accordingly, it is possible to reduce the influence of noise on the A/D converter by changing only the A/D converter without changing the configurations of other devices around the A/D converter. When plural A/D converters are connected in parallel to increase the number of channels or when plural A/D converters are connected in parallel to operate at a high speed by a time interleaving operation, it is possible to reduce inter-symbol interference between the A/D converters due to kickback noise generated from the individual A/D converters adjacent to each other.

In Embodiment 1-2, the digital section 130c is configured to operate in response to the clock signal φ2′ having the jitter added thereto. However, this embodiment is not limited to this configuration, but the effect of enhancing the resistance of the A/D converter itself to noise is not damaged at all even when the clock signal φ2 not having the jitter added thereto is input to the digital section 130c. By adding the jitter to the clock signal of the digital section 130c, it is possible to reduce a peak of noise in the signal output from the A/D converter and thus to reduce the influence of noise from the A/D converter on the other devices.

The clock signal generator 143 may be disposed outside the A/D converter. When the sampling circuit of the A/D converter shown in FIG. 22 is constructed as an independent device, the control circuit 139 may be disposed outside the A/D converter.

In Embodiment 1, the control circuit 139 is configured to generate the clock signals φ1, φ2, φ1′, φ2′, and φ1″ and the jitter selector 142 is configured to select any one of these five clock signals. Accordingly, any of a mode in which the sampling circuit is made to operate without using the clock signal φ1″ as in Embodiment 1-1 and a mode in which the continuous section 130a is supplied with the clock signal φ1″ is made to operate as in Embodiment 1-2 can be selected. In Embodiment 1-1, since the clock signal φ1″ is not used, the control circuit 139 may be configured to generate the clock signals φ1, φ2, φ1′, and φ2′ and the jitter selector 142 may be configured to select some of these four clock signals.

Embodiment 2 will be described below.

In Embodiment 2, the sampling circuit according to the present invention is applied to a D/A converter.

Embodiment 2-1 and Embodiment 2-2 will be described below as specific examples of the sampling circuit according to Embodiment 2. Embodiment 2-1 provides a sampling circuit using the clock signals φ11 and φ12 not having the jitter added thereto and the clock signals φ11′ and φ12′ having the jitter added thereto as clock signals. Embodiment 2-2 provides a sampling circuit using the clock signal φ11″ having the jitter added to only the rising portion of the clock signal φ11 in addition to the clock signals φ11, φ12, φ11', and φ12'.

Figure 23:
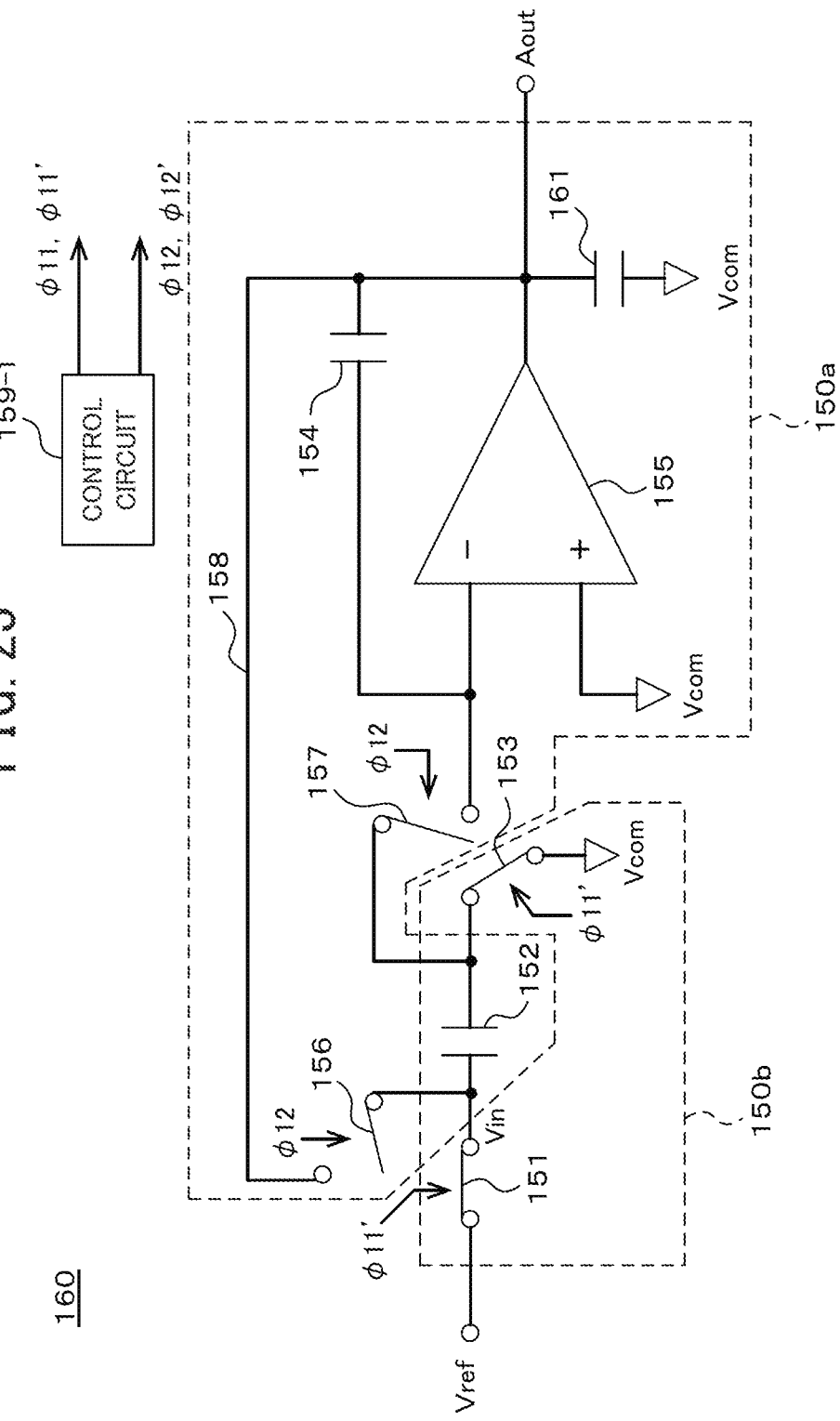
FIG. 23 is a diagram illustrating a sampling circuit according to Embodiment 2-1.

Embodiment 2-1 will be first described. FIG. 23 is a diagram illustrating the D/A converter according to Embodiment 2-1.

The shown D/A converter includes a sampling circuit 160 and a control circuit 159-1.

The sampling circuit 160 includes a sampling and holding section 150b that intermittently samples an input signal (reference signal $V_{ref}$; the sampled reference signal $V_{ref}$ is referred to as an input signal $V_{in}$) based on an input digital signal $D_{in}$ and that holds and transfers the sampled signal and a continuous section 150a that outputs the signal transferred from the sampling and holding section 150b as an analog signal $A_{out}$.

The control circuit 159-1 generates and outputs clock signals φ11 and φ12 not having the jitter added thereto and clock signals φ11' and φ12' having the jitter added thereto. The clock signal φ12 not having the jitter added thereto is input to the continuous section 150a and the clock signal φ11' having the jitter added thereto is input to the sampling and holding section 150b.

The sampling and holding section 150b includes a capacitor 152 that accumulates charge generated by the input signal $V_{in}$, and a switch 151 and a switch 153 that accumulate the charge in the capacitor 152. The switch 151 and the switch 153 perform a switching operation in response to the clock signal φ11'.

The continuous section 150a includes an operational amplifier 155, a feedback path 158 for inputting the analog output signal $A_{out}$ of the operational amplifier 155 to the inverting input terminal, a capacitor 154 that accumulates charge generated by the analog output signal $A_{out}$ on the feedback path 158, and a switch 156 and a switch 157 that transfer the charge accumulated in the capacitor 152 as the analog output signal $A_{out}$. The clock signal φ12 not having the jitter added thereto is output to the switches 156 and 157 of the continuous section 150a, and the continuous section 150a operates in response to the clock signal φ12.

The continuous section 150a further includes a capacitor 154. An LPF is formed by the capacitor 154, and the cutoff frequency of the LPF is determined by the capacity ratio of the capacitor 154 and the capacitor 152 and the switching frequency.

Figure 24:
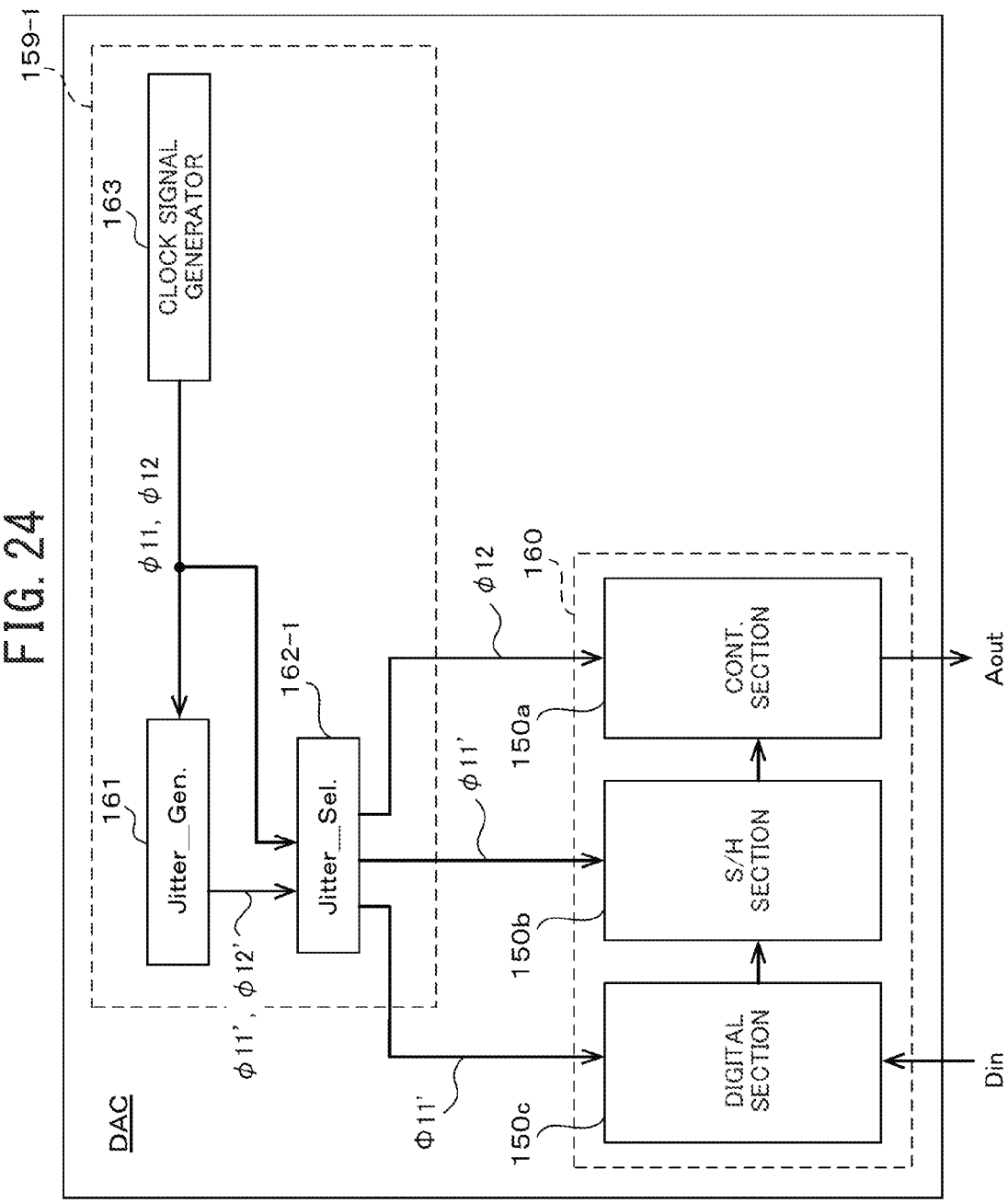
FIG. 24 is a functional block diagram illustrating a D/A converter including a sampling circuit and a control circuit according to Embodiment 2-1.

FIG. 24 is a diagram illustrating a D/A converter (described as DAC in the drawing) including the sampling circuit 160 and the control circuit 159-1 shown in FIG. 23.

The control circuit 159-1 supplies the clock signal φ12 not having the jitter added thereto to the continuous section 150a, supplies the clock signal φ11' having the jitter added thereto to the digital section 150c, and supplies the clock signal φ11' having the jitter added thereto to the sampling and holding section 150b.

That is, the control circuit 159-1 includes a clock signal generator 163 that generates clock signals φ11 and φ12 not having the jitter added thereto, a jitter generator (described as Jitter_Gen. in FIG. 24) 161 that generates clock signals φ11' and φ12' having the jitter added thereto, and a jitter selector (indicated by Jitter_Sel. in FIG. 24) 162-1 that receives the clock signals φ11, φ12, φ11', and φ12', that selects and outputs the clock signal φ11' generated by the jitter generator 161 to the sampling and holding section 150b, that selects and outputs the clock signal φ11' to the digital section 150c, and selects and outputs the clock signal φ12 to the continuous section 150a.

The jitter selector 162-1 may be removed, the clock signal φ11' may be directly output from the jitter generator 161 to the sampling and holding section 150b and the digital section 150c, and the clock signal φ12 may be directly output from the clock signal generator 163 to the continuous section 150a.

According to Embodiment 2-1, similarly to Embodiment 1-1, modulation is not applied to the signal transfer function of the D/A converter but modulation can be applied to the noise transfer function. Accordingly, without adding noise to a signal to be transmitted, it is possible to disperse only the noise in the in-band and thus to reduce the peak of the spectrum thereof.

The feedback path through the capacitor 154 may be removed.

Figure 25:
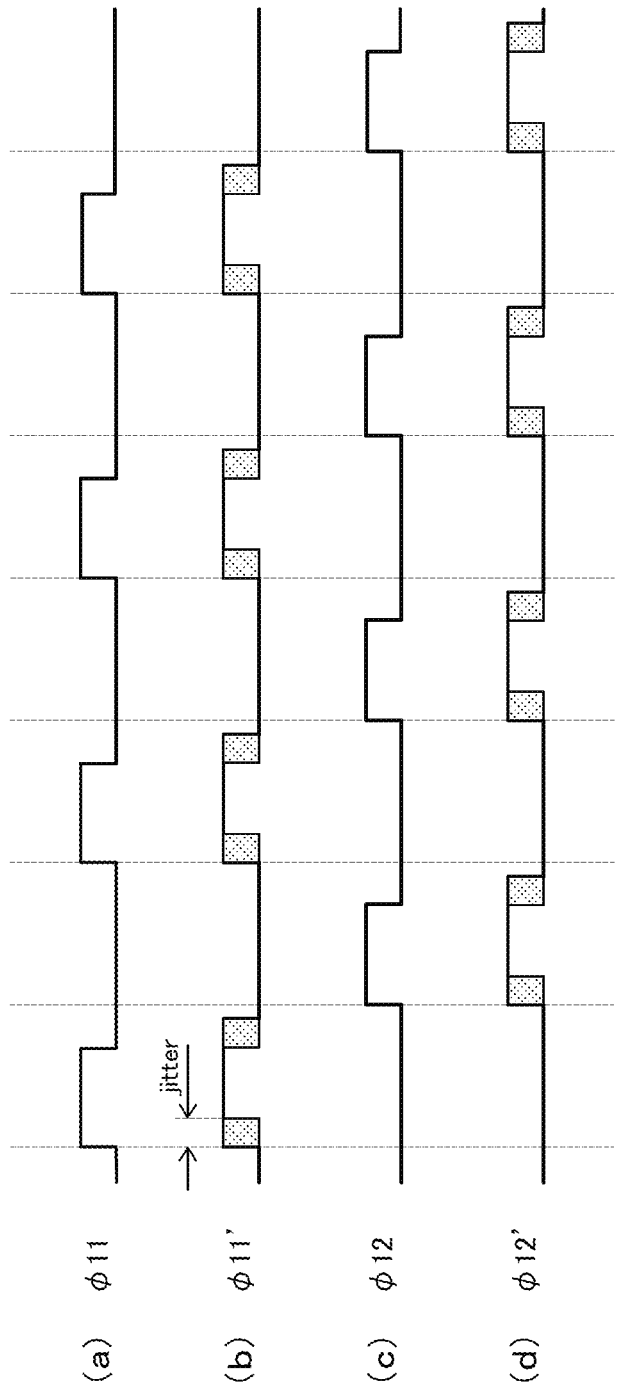
FIGS. 25(a)-(d) are diagrams illustrating timing charts of clock signals φ11, φ11', φ12, and φ12'.

(a) to (d) of FIG. 25 are diagrams illustrating timing charts of the clock signals φ11, φ11', φ12, and φ12' described with reference to FIGS. 23 and 24.

(a) of FIG. 25 shows a timing chart of the clock signal φ11, (b) of FIG. 25 shows a timing chart of the clock signal φ11', (c) of FIG. 25 shows a timing chart of the clock signal φ12, and (d) of FIG. 25 shows a timing chart of the clock signal φ12'.

The switches supplied with the clock signals are driven so that the switches are turned on in a section in which the clock signals are at the high level and the switches are turned off in a section in which the clock signals are at the low level. As shown in (b) and (d) of FIG. 25, the jitter of the clock signals φ11' and φ12' is added to only the rising and falling edges of the clock signal φ11 and the clock signal φ12. The rising edges of the clock signals φ11, φ12, φ11', and φ12' serve as triggers for determining an operation start time of circuit elements operating in response to the clock signals. The falling edges of the clock signals serve as triggers for determining the operation end time of circuit elements operating in response to the clock signals.

The clock signal φ12 is a non-overlap clock signal which is not changed to the high level at the same time as the clock signal φ11. The clock signal φ12' is a non-overlap clock signal which is not changed to the high level at the same time as the clock signal φ11'. In these clock signals, the clock signal φ11 and the clock signal φ11' generated by adding the jitter to the clock signal φ11 have a reverse-phased and non-overlapping relationship in which both are not changed to a high level at the same time, and the clock signal φ12 and the clock signal φ12' generated by adding the jitter to the clock signal φ12 have a reverse-phased and non-overlapping relationship in which both are not changed to a high level at the same time.

Figure 26:
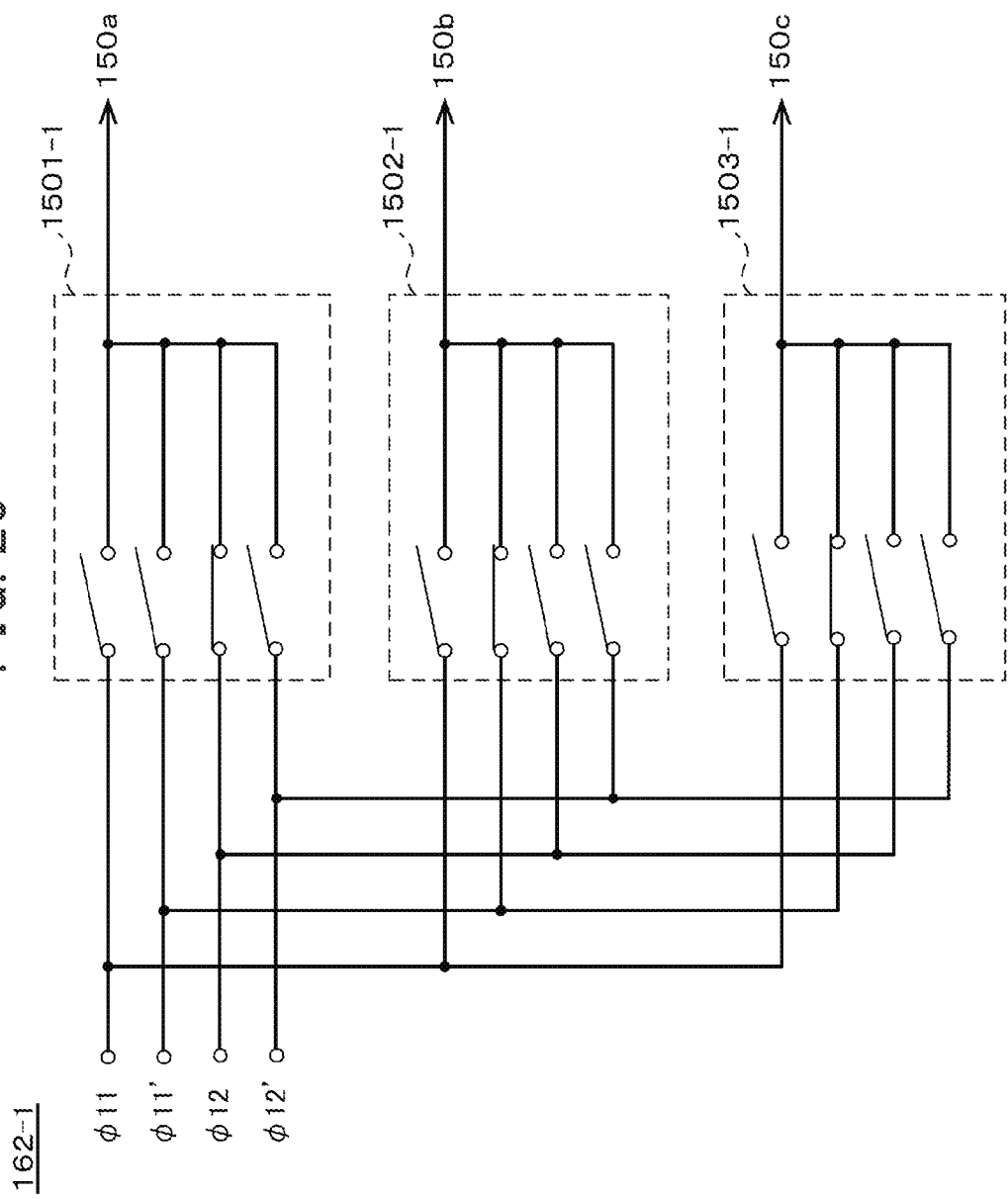
FIG. 26 is a diagram illustrating a specific configuration of a jitter selector.

FIG. 26 is a diagram illustrating a specific configuration of the jitter selector 162-1 shown in FIG. 24.

As shown in FIG. 26, the jitter selector 162-1 includes switch sections 1501-1, 1502-1, and 1503-1 each having four switches. The switch section 1501-1 selects a clock signal to be output to the continuous section 150a. The switch section 1502-1 selects a clock signal to be output to the sampling and holding section 150b, and the switch section 1503-1 selects a clock signal to be output to the digital section 150c. According to the jitter selector 162-1, the clock signal φ12 is selected out of the clock signals φ11, φ11', φ12, and φ12' and is supplied to the continuous section 150a shown in FIG. 24. The clock signal φ11' is selected out of the clock signals φ1, φ1', φ2, and φ2' and is supplied to the sampling and holding section 150b shown in FIG. 24, and the clock signal φ11' is selected out of the clock signals φ11, φ11', φ12, and φ12' and is supplied to the digital section 150c shown in FIG. 24.

According to Embodiment 2-1, it is possible to enhance the resistance to noise of the D/A converter itself, instead of reducing noise generated from devices around the D/A converter. Accordingly, it is possible to reduce the influence of noise on the D/A converter only by changing the D/A converter without changing the configurations of the other devices around the D/A converter.

Embodiment 2-1 can be embodied by only adding a circuit for adding the jitter to a clock signal. Accordingly, advanced semiconductor process technology or an increase in the number of pins of a chip is not necessary and it is thus possible to prevent an increase in cost of the D/A converter. According to Embodiment 2-1, since the D/A converter can be disposed sufficiently close to other devices without considering of the influence of noise, it is possible to reduce the size of a device including the D/A converter.

In Embodiment 2-1, it is possible to reduce noise suppressing requests to a decoupling capacitor which is generally installed for the purpose of reducing noise generated from devices around the D/A converter. According to Embodiment 2-1, since the noise suppressing requests to the decoupling capacitor can be reduced, it may be possible to make the decoupling capacitor itself unnecessary.

Embodiment 2-1 is not limited to the configuration in which the clock signal φ11' having the jitter added thereto is input to the digital section 150c. The effect of enhancing the resistance of the D/A converter itself to noise is not damaged even when the clock signal φ11 not having the jitter added thereto is input to the digital section 150c.

In Embodiment 2-1, the clock signal generator 163 may be disposed outside the D/A converter. When the sampling circuit of the D/A converter shown in FIGS. 23 and 24 is constructed as an independent device, the control circuit 159-1 may be disposed outside the device.

A sampling circuit according to Embodiment 2-2 of the present invention and a D/A converter using the sampling circuit will be described below.

The inventors of the sampling circuit and the D/A converter according to the present invention found that periodic noise generated from the D/A converter itself or mixed from other electronic devices is replicated in the sampling and holding operation of a signal in the continuous section of the sampling circuit according to Embodiment 2-1. The continuous section 150a starts outputting the signal transferred from the sampling and holding section 150b as an analog signal $A_{out}$ at the rising edge which is a trigger for determining an operation start time, and samples and holds the analog signal $A_{out}$ of the operation end time until the next operation start time at the falling edge which is a trigger for determining an operation end time. Similarly to the sampan circuit, when periodic noise is superimposed in sampling and holding operation at the operation end time, noise is replicated to the analog signal $A_{out}$.

Embodiment 2-2 is made to disperse and reduce noise mixed in the continuous section.

Embodiment 2-2 is different from Embodiment 2-1, in that a clock signal having the jitter added thereto is also input to the continuous section so as to disperse noise mixed in the continuous section. A jitter is not added to an edge which is a trigger for determining an operation start time of the clock signal to be input to the continuous section and the jitter is added to an edge which is a trigger for determining an operation end time. Accordingly, by applying modulation to only the periodic noise using the jitter without applying modulation to the signal component of the analog output signal $A_{out}$, it is possible to efficiently separate the signal component from the mixed periodic noise.

Figure 27:
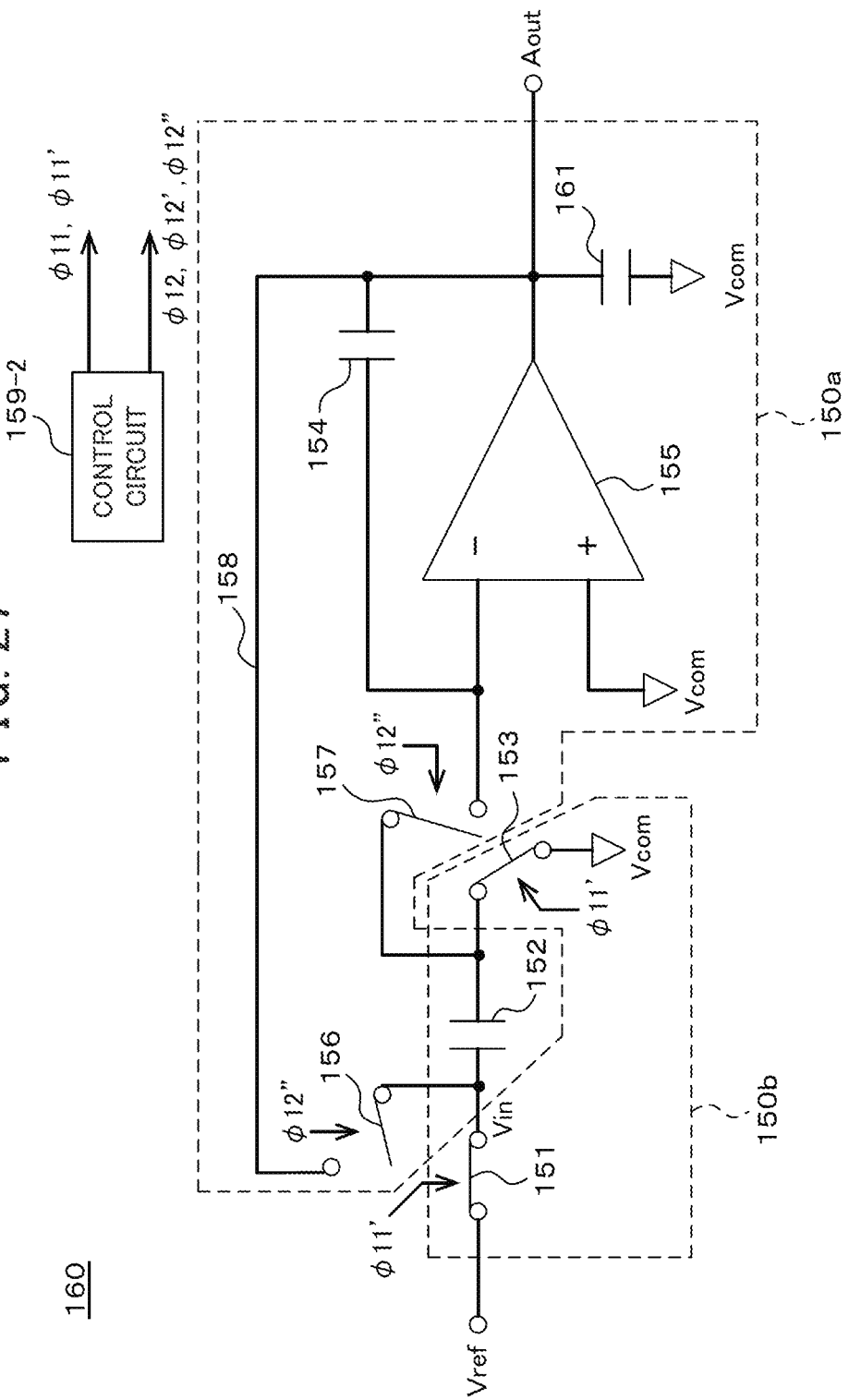
FIG. 27 is a diagram illustrating a sampling circuit according to Embodiment 2-2.

FIG. 27 is a diagram illustrating the D/A converter according to Embodiment 2-2.

In the configuration shown in the drawing according to Embodiment 2-2, the same elements as shown in the drawings used for description of Embodiment 2-1 will be referenced by the same reference numerals and some of description thereof will not be repeated.

The shown D/A converter includes a sampling circuit 160 and a control circuit 159-2. The sampling circuit 160 includes a sampling and holding section 150b that intermittently samples an input signal (reference signal $V_{ref}$; the sampled reference signal $V_{ref}$ is referred to as an input signal $V_{in}$) based on a digital signal $D_{in}$ (not shown) input to the digital section (not shown in FIG. 27) and that holds and transmits the sampled signal and a continuous section 150a that outputs the signal transferred from the sampling and holding section 150b as an analog signal $A_{out}$.

The continuous section 150a includes an operational amplifier 155, a feedback path 158 for inputting the analog output signal $A_{out}$ of the operational amplifier 155 to the inverting input terminal, a capacitor 154 that accumulates charge generated by the analog output signal $A_{out}$ on the feedback path 158, and a switch 156 and a switch 157 that transfer the charge accumulated in the capacitor 152 as the analog output signal $A_{out}$. The clock signal φ12" is input to the switches 156 and 157 of the continuous section 150a, and the continuous section 150a operates in response to the clock signal φ12". In the continuous section 150a, an LPF (Low-Pass Filter) is formed by the capacitor 154, and the cutoff frequency of the LPF is determined by the capacity ratio of the capacitor 154 and the capacitor 152 and the switching frequency. In Embodiment 2-2, the capacitor 154 may not be employed.

The sampling and holding section 150b includes a capacitor 152 that accumulates charge generated by the input signal $V_{in}$, and a switch 151 and a switch 153 that accumulate the charge in the capacitor 152. The switch 151 and the switch 153 perform a switching operation in response to the clock signal φ11'.

The control circuit 159-2 generates a clock signal φ11' having the jitter added to the rising and falling edges of the clock signal φ11, a clock signal φ12' having the jitter added to the rising and falling edges of the clock signal φ12, and a clock signal φ12" not having the jitter added to the rising edge but having the jitter added to the falling edge. The clock signal φ12" is output to the switches 156 and 157 of the continuous section 150a, and the continuous section 150a operates in response to the clock signal φ12". The clock signal φ11' is input to the switches 151 and 153 of the sampling and holding section 150b.

Figure 28:
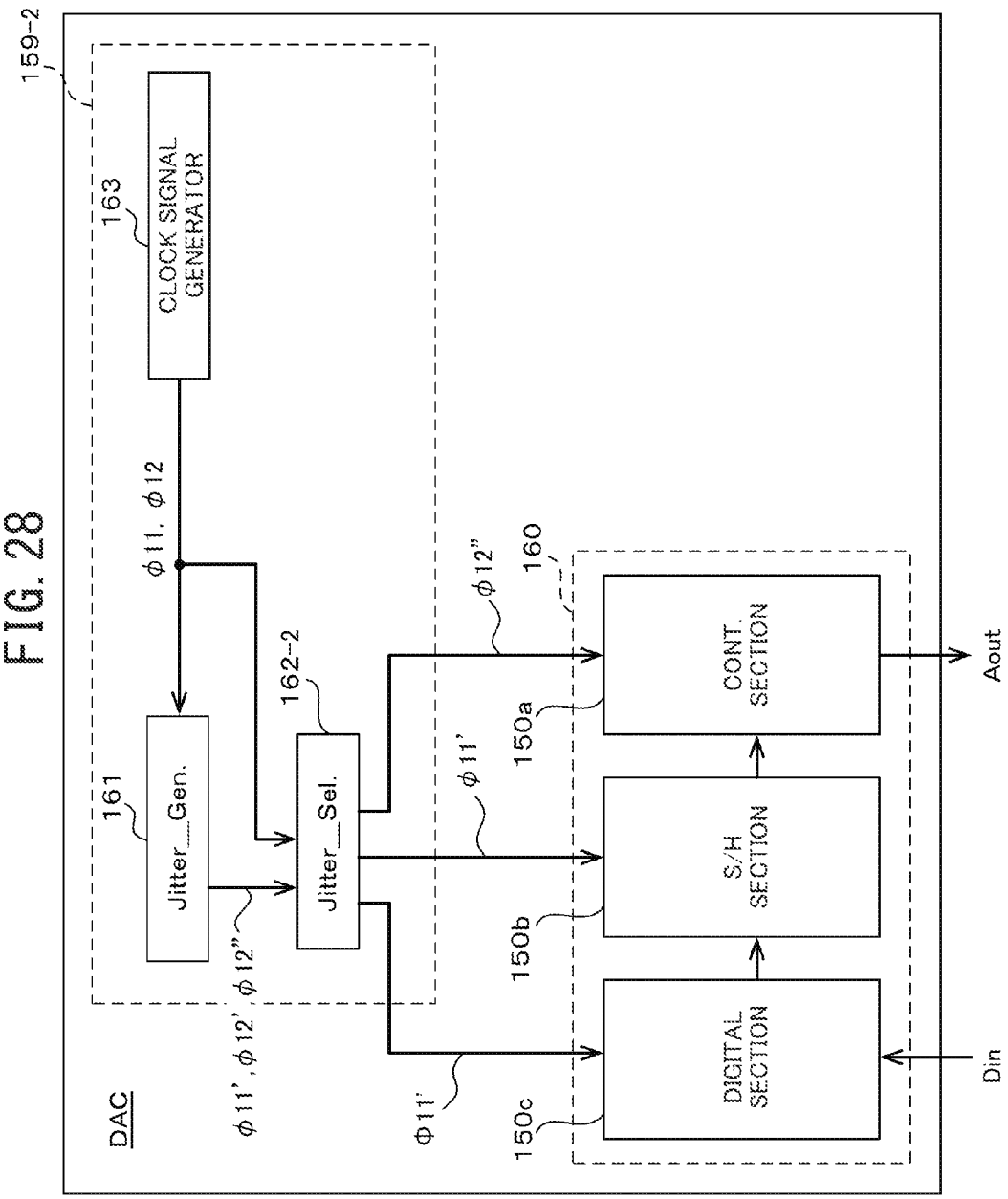
FIG. 28 is a functional block diagram illustrating a D/A converter including a sampling circuit and a control circuit according to Embodiment 2-2.

FIG. 28 is a functional block diagram illustrating a D/A converter (described as DAC in the drawing) including the sampling circuit 160 and the control circuit 159-2 shown in FIG. 27.

The control circuit 159-2 includes a clock signal generator 163 that generates clock signals φ11 and φ12 not having the jitter added thereto, a jitter generator (described as Jitter_Gen. in FIG. 28) 161 that generates clock signals φ11' and φ12' having the jitter added to the clock signals φ11 and φ12 and a clock signal φ12" not having the jitter added to the rising edge which is a trigger for determining the operation start time but having the jitter added to the falling edge which is a trigger for determining the operation end time, and a jitter selector (indicated by Jitter_Sel. in FIG. 28) 162-2 that receives the clock signals φ11, φ12, φ11', φ12', and φ12", that selects and outputs the clock signal φ11' generated by the jitter generator 161 to the sampling and holding section 150b and the digital section 150c, and that selects and outputs the clock signal φ12" to the continuous section 150a. For example, the clock signal φ12" having the jitter added to only the falling edge of the signal is generated by inputting the clock signal φ12 and the clock signal φ12' to an OR circuit.

The clock signal φ12 is a non-overlap clock signal which is not changed to the high level at the same time as the clock signal φ11. The clock signal φ12' is a non-overlap clock signal which is not changed to the high level at the same time as the clock signal φ11'. In these clock signals, the clock signal φ11 and the clock signal φ11' generated by adding the jitter to the clock signal φ11, and the clock signal φ12 and the clock signals φ12' and φ12" generated by adding the jitter to the clock signal φ12 have a reverse-phased and non-overlapping relationship in which both are not changed to a high level at the same time.

According to Embodiment 2-2, since the signal component in the sampling and holding operation of the continuous section 150a is a DC component, modulation is not applied to the signal component by the jitter added to the operation clock signal.

Since the periodic noise generated from the D/A converter itself or mixed from other electronic devices is an AC component, modulation is applied to the noise component by the jitter added to the operation clock signal, thereby obtaining a noise dispersion effect.

In other words, in Embodiment 2-2, modulation due to the jitter is applied to only the NTF, not the STF, and it is thus possible to efficiently separate the periodic noise mixed into the analog output signal from the signal component. Accordingly, in Embodiment 2-2, it is possible to disperse only noise in the in-band without adding noise to a signal to be transmitted and to reduce a spectrum peak of the noise.

Figure 29:
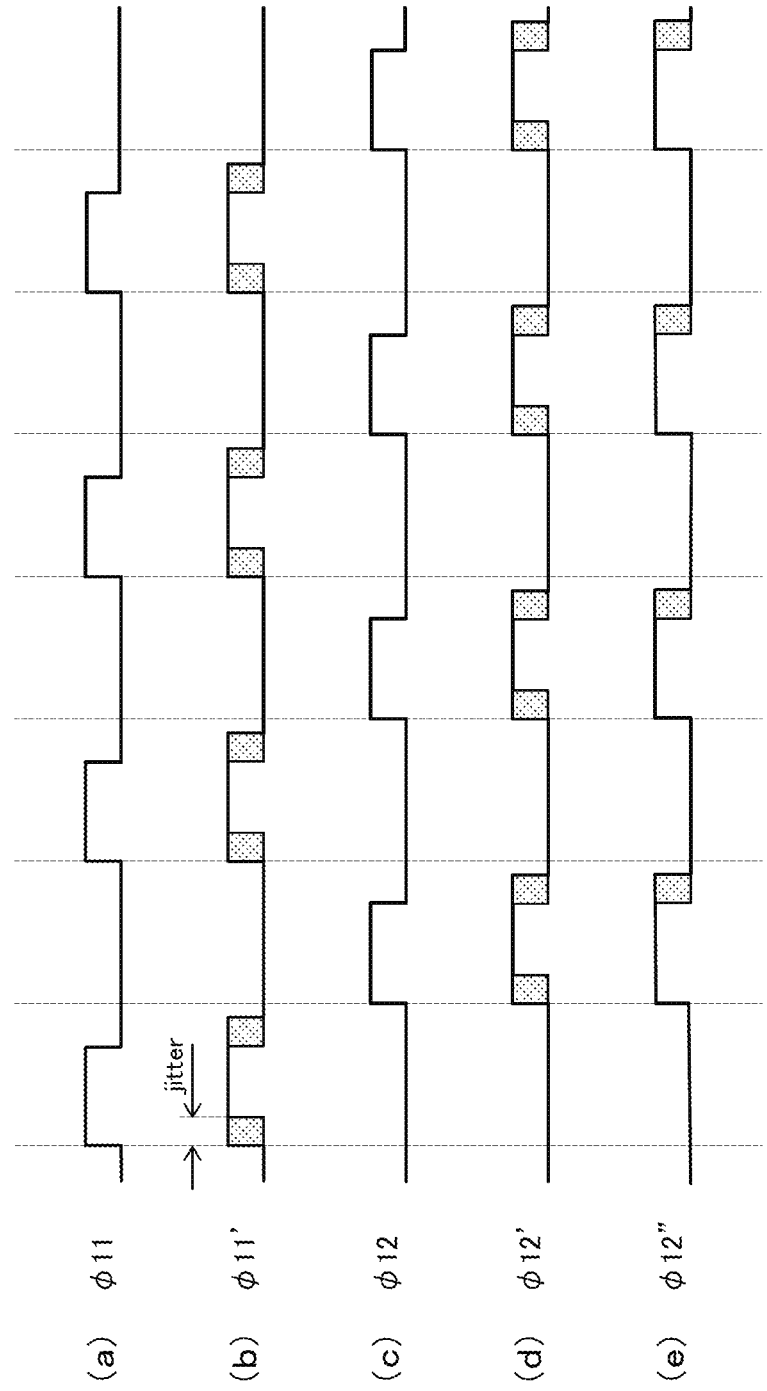
FIGS. 29(a)-(e) are diagrams illustrating timing charts of clock signals φ11, φ11', φ12, φ12', and φ12"

(a) to (e) of FIG. 29 are diagrams illustrating timing charts of the clock signals φ11, φ11', φ12, φ12', and φ12" described with reference to FIGS. 27 and 28.

(a) of FIG. 29 shows a timing chart of the clock signal φ11, (b) of FIG. 29 shows a timing chart of the clock signal φ11', (c) of FIG. 29 shows a timing chart of the clock signal φ12, (d) of FIG. 29 shows a timing chart of the clock signal φ12', and (e) of FIG. 29 shows a timing chart of the clock signal φ12".

The switches supplied with the clock signals are driven so that the switches are turned on in a section in which the clock signals are at the high level and the switches are turned off in a section in which the clock signals are at the low level.

As can be clearly seen from (a) to (e) of FIG. 29, in the clock signals φ11' and φ12', the jitter is added to only the rising and falling edges of the clock signals. However, in the clock signal φ12", the jitter is added to only the falling edge of the clock signal.

In the continuous section 150a, the variation of the operation start time at which the signal transferred by the sampling and holding section 150b is output as an analog signal $A_{out}$ causes frequency modulation in a signal component. However, in Embodiment 2-2, the jitter does not affect the operation start time at which the signal transmitted by the sampling and holding section 150b is output as the analog signal $A_{out}$ by causing the switches 156 and 157 of the continuous section 150a to operate in response to the clock signal φ12". Accordingly, the clock signal φ12" does not modulate the signal component of the analog output signal $A_{out}$. Since the operation end time of the clock signal φ12" is dispersed by the jitter, the mixed periodic noise can be dispersed by the jitter.

Figure 30:
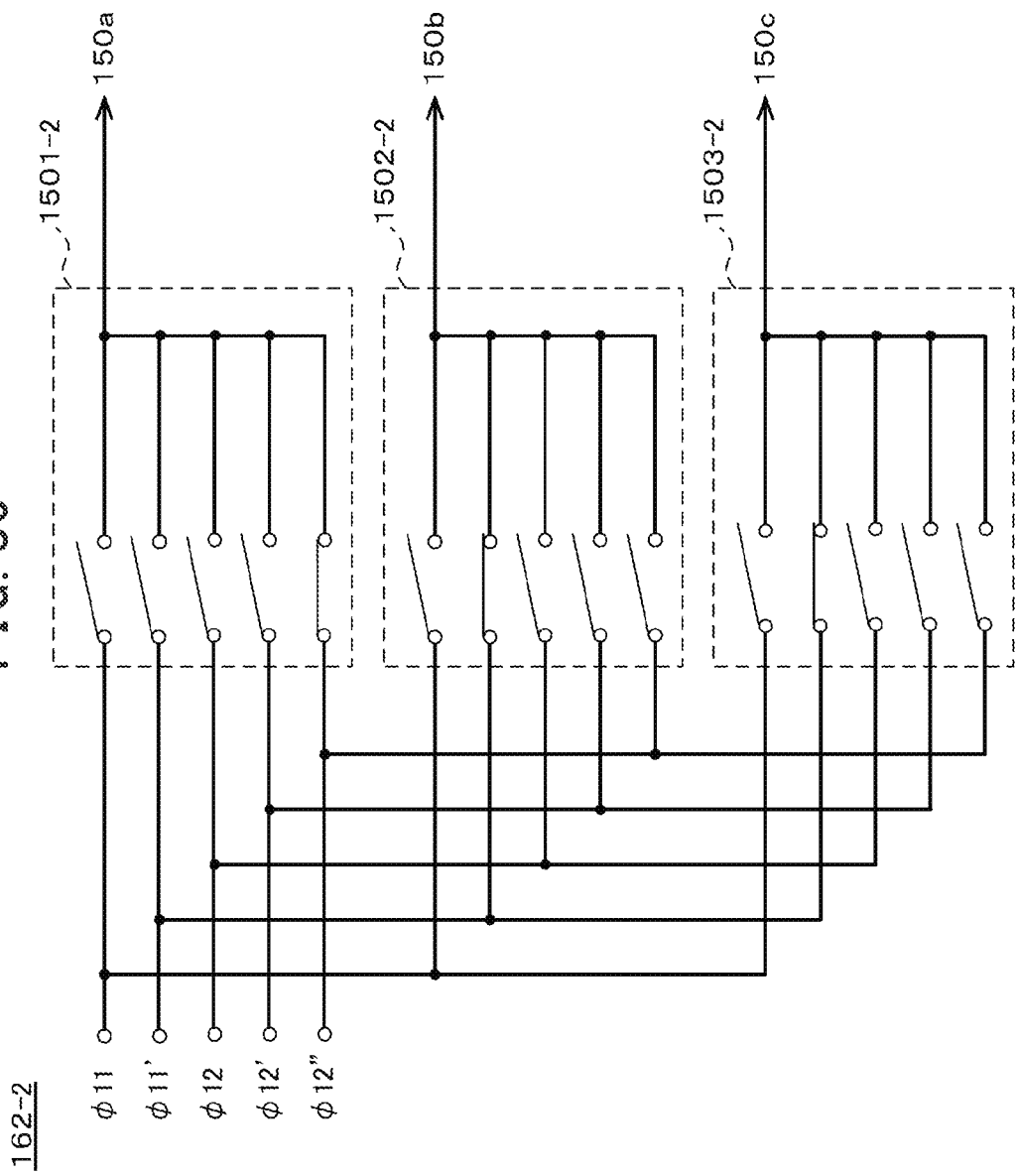
FIG. 30 is a diagram illustrating a specific configuration of a jitter selector.

FIG. 30 is a diagram illustrating a specific configuration of the jitter selector 162-2 shown in FIG. 28.

As shown in FIG. 30, the jitter selector 162-2 includes switch sections 1501-2, 1502-2, and 1503-2 each having five switches. The switch section 1501-2 selects a clock signal to be output to the continuous section 150a. The switch section 1502-2 selects a clock signal to be output to the sampling and holding section 150b. The switch section 1503-2 selects a clock signal to be output to the digital section 150c.

According to the jitter selector 162-2, the clock signal φ11' is selected and supplied to the sampling and holding section 150b and the digital section 150c shown in FIG. 28. The clock signal φ12" is supplied to the continuous section 150a shown in FIG. 28.

According to Embodiment 2-2, similarly to the sampling circuit and the D/A converter according to Embodiment 2-1, it is possible to enhance the resistance to noise of the D/A converter itself, instead of reducing noise generated from devices around the D/A converter. Accordingly, it is possible to reduce the influence of noise on the D/A converter only by changing the D/A converter without changing the configurations of the other devices around the D/A converter.

Embodiment 2-2 can be embodied by only adding a circuit for adding the jitter to a clock signal. Accordingly, advanced semiconductor process technology or an increase in the number of pins of a chip is not necessary and it is thus possible to prevent an increase in cost of the D/A converter. According to Embodiment 2-2, since the D/A converter can be disposed sufficiently close to other devices without considering of the influence of noise, it is possible to reduce the size of a device including the D/A converter.

In Embodiment 2-2, it is possible to reduce noise suppressing requests to a decoupling capacitor which is generally installed for the purpose of reducing noise generated from devices around the D/A converter. According to this embodiment, since the noise suppressing requests to the decoupling capacitor can be reduced, it may be possible to make the decoupling capacitor itself unnecessary.

In Embodiment 2-2, since the clock signal φ12" having the jitter added thereto is input to the continuous section 150a, it is possible to disperse the periodic noise generated by the sampling and holding operation of the continuous section 150a and to lower the peak thereof, in addition to the above-mentioned advantages. In this embodiment, by not adding the jitter to the rising edge of the clock signal φ12", it is possible to prevent noise from being superimposed on the analog output signal $A_{out}$.

Embodiment 2-2 is not limited to the configuration in which the clock signal φ11' having the jitter added thereto is input to the digital section 150c. That is, the effect of enhancing the resistance of the D/A converter itself to noise is not damaged even when the clock signal φ11 not having the jitter added thereto is input to the digital section 150c.

The clock signal generator 163 may be disposed outside the D/A converter. When the sampling circuit of the D/A converter shown in FIGS. 27 and 28 is constructed as an independent device, the control circuit 159-2 may be disposed outside the D/A converter.

Embodiment 2-2 provides the sampling circuit using the clock signals φ11, φ12, φ11', and φ12' and the clock signal φ11" having the jitter added to only the rising edge of the clock signal φ11. Accordingly, by switching the output destination of the clock signals using only the clock signals φ11, φ12, φ11', and φ12' in the sampling circuit according to Embodiment 2-2, it is possible to realize the sampling circuit according to Embodiment 2-1. Therefore, any one of a mode in which the sampling circuit according to Embodiment 2-2 operates without using the clock signal φ1" as in Embodiment 2-1 and a mode in which the sampling circuit operates together using the clock signal φ1" as in Embodiment 2-2 can be arbitrarily selected.

Embodiment 3 of the present invention will be described below.

Embodiment 3 provides a CODEC in which the A/D converter described in Embodiment 1 and the D/A converter described in Embodiment 2 are combined.

A CODEC according to Embodiment 3-1 will be first described.

Figure 31:
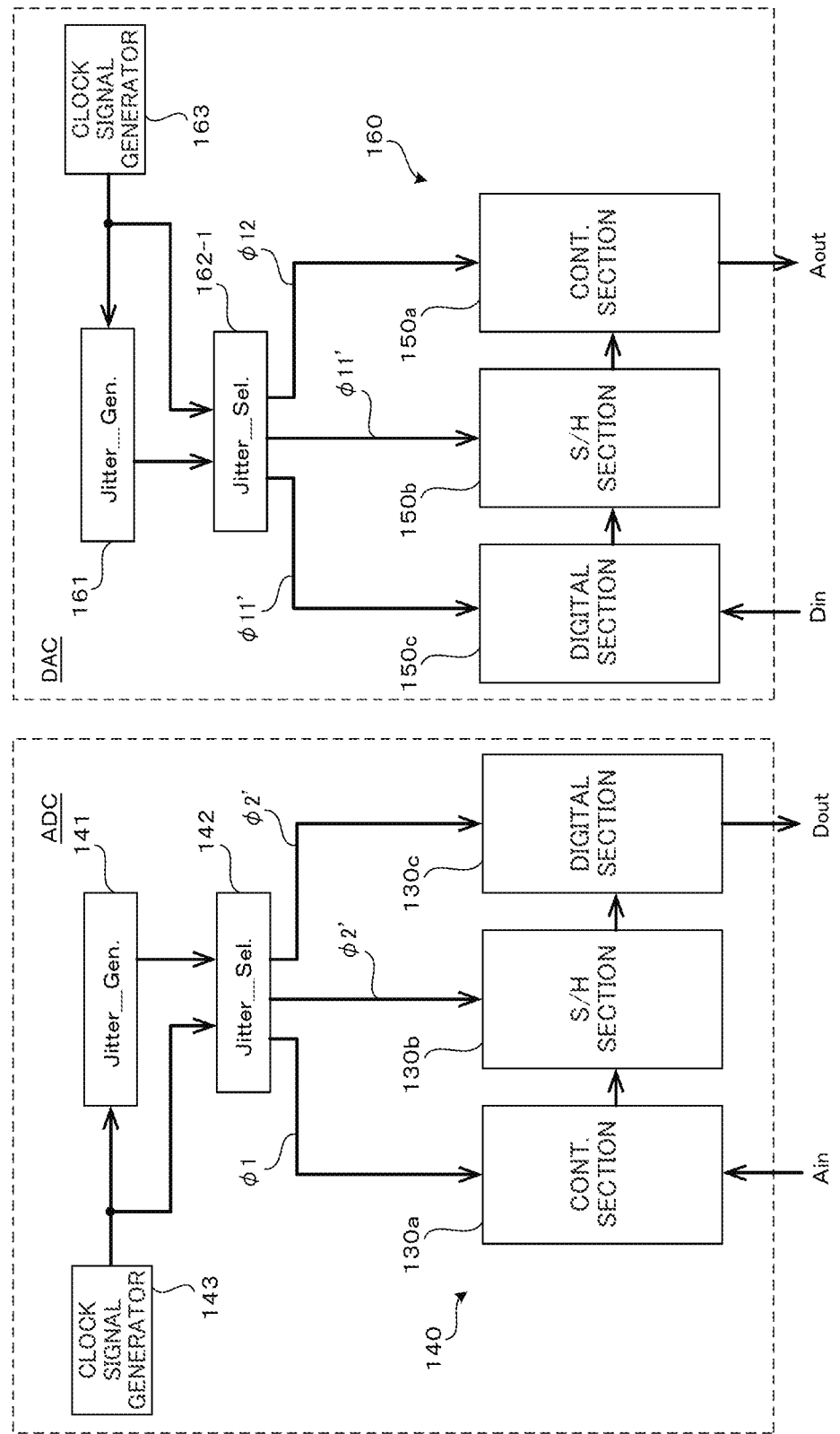
FIG. 31 is a diagram illustrating a CODEC according to Embodiment 3.

FIG. 31 is a diagram illustrating the CODEC according to Embodiment 3-1.

In FIG. 31, the same elements as described in Embodiment 1-1 and Embodiment 2-1 are referenced by the same reference numerals and description thereof will not be repeated.

In this way, when the A/D converter and the D/A converter are combined, the A/D converter and the D/A converter are disposed to be close to each other and thus noise generated from the A/D converter and the D/A converter affects each other.

However, in the CODEC according to Embodiment 3-1, since the sampling and holding sections of the A/D converter and the D/A converter are configured to operate in response to the clock signals having the jitter added thereto, it is possible to effectively disperse periodic noise due to inrush current in an analog section and to suppress generation of dominant radiation noise itself.

In the CODEC according to Embodiment 3-1, since the sampling and holding sections of the A/D converter and the D/A converter are configured to operate in response to the clock signals having the jitter added thereto, modulation is not applied to the STF but modulation is applied to only the NTF. Accordingly, it is possible to suppress an influence of radiation noise generated from the A/D converter and the D/A converter on themselves and to suppress an influence of radiation noise generated from a device other than the A/D converter and the D/A converter. Accordingly, it is possible to expect suppression of generation of radiation noise and a synergy effect of noise suppression due to enhancement in resistance to the radiation noise.

Accordingly, in the CODEC, the A/D converter and the D/A converter can be arranged to be satisfactorily close to each other without considering noise. Embodiment 3-1 is advantageous for constructing a small-sized CODEC.

In Embodiment 3-1, it is possible to reduce noise suppressing requests to a decoupling capacitor which is generally installed for the purpose of reducing noise generated from devices around the CODEC. According to Embodiment 3-1, since the noise suppressing requests to the decoupling capacitor can be reduced, it may be possible to make the decoupling capacitor itself unnecessary.

(a) and (b) of FIG. 32 are diagrams illustrating the effects of Embodiment 3-1.

(b) of FIG. 32 shows an example where a clock signal having the jitter added thereto is input to the digital section as well as the sampling and holding section.

(a) of FIG. 32 is a diagram illustrating characteristics of a CODEC according to the related art.

(b) of FIG. 32 is a diagram illustrating characteristics of the CODEC according to Embodiment 3-1.

The vertical axis THD+N in (a) and (b) of FIG. 32 represents a distortion (a ratio of signal to noise of the output signal at 20 Hz to 20 kHz) of the output signal of the CODEC. The horizontal axis in (a) and (b) of FIG. 32 represents a frequency difference between the sampling frequency (the frequency of the sampling operation) of the A/D converter and the sampling frequency of the D/A converter.

As can be clearly seen from comparison of (a) and (b) of FIG. 32, the distortion of the output signal in the CODEC according to Embodiment 3-1 is smaller than that in the related art, even when the sampling frequencies of the A/D converter and the D/A converter are the same (the operation frequency difference of the horizontal axis is 0) or even when the sampling frequencies of the A/D converter and the D/A converter have a difference of about ±25 Hz. According to Embodiment 3-1, the distortion of the output signal can be reduced in comparison with the related art, even in an asynchronous CODEC in which the A/D converter and the D/A converter operate in response to different sampling clock signals or even in a synchronous CODEC in which both operate in response to the same sampling clock signal.

In Embodiment 3-1, the frequency of the jitter added to the operation clock is set to be in a range of 48 kHz to 384 kHz. At any frequency of the jitter in the range of 48 kHz to 384 kHz, Embodiment 3-1 can reduce the distortion of the output signal in comparison with the related art, similarly to the result shown in (b) of FIG. 32.

FIG. 31 shows the CODEC in which the A/D converter described in Embodiment 1-1 and the D/A converter described in Embodiment 2-1 are combined, but a CODEC in which a clock signal having the jitter added thereto is also supplied to the continuous section can be also constructed by combining the A/D converter described in Embodiment 1-2 and the D/A converter described in Embodiment 2-2.

A CODEC according to Embodiment 3-2 will be described below.

Figure 33:
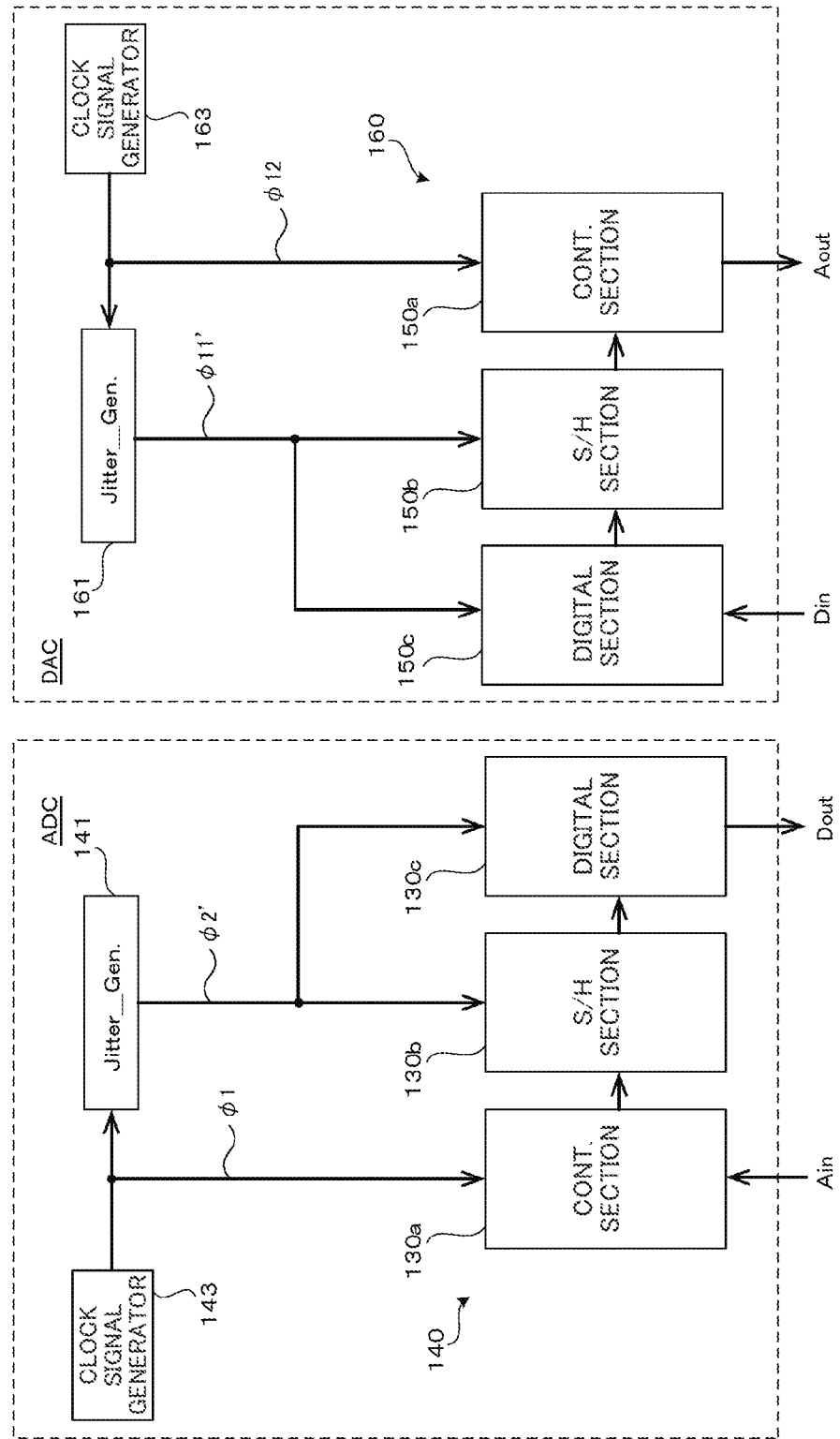
FIG. 33 is a diagram illustrating another CODEC according to Embodiment 3.

FIG. 33 is a diagram illustrating the CODEC according to Embodiment 3-2.

In Embodiment 3-2, a CODEC in which the A/D converter according to Embodiment 1-1 and the D/A converter according to Embodiment 2-1 are combined does not include the jitter selectors 142 and 162-1. In this embodiment, the same advantages as achieved in the CODEC according to Embodiment 3-1 can be achieved.

The sampling circuit according to the present invention is not limited to the A/D converter, the D/A converter, and the CODEC as described above, but may be used, for example, for a charge pump.

The scope of the present invention is not limited to the illustrated and described exemplary embodiments, but includes all embodiments causing an effect equivalent to the object of the present invention. The scope of the invention is not limited to combinations of features of the inventions defined in the respective claims, but can be defined by all desired combinations of specific features out of all the disclosed features.

INDUSTRIAL APPLICABILITY

The present invention can be used for all types of electronic devices having a D/A conversion function and an A/D conversion function, in addition to A/D converters, D/A converters, and CODECS.

REFERENCE SIGNS LIST

101-1, 101-2, 102-1, 102-2, 131, 133, 135, 151, 153, 156, 157: switch
111-1, 111-2, 112, 113, 132, 152, 154, 161: capacitor
121-1, 121-2, 134, 155: operational amplifier
130$a$, 150$a$: continuous section
130$b$, 150$b$: sampling and holding section
130$c$, 150$c$: digital section
138, 158: feedback path
139, 159-1, 159-2: control circuit
140, 160: sampling circuit
141, 161: jitter generator
142, 162-1, 162-2: jitter selector
143, 163: clock signal generator

The invention claimed is:

1. A sampling circuit comprising:
a continuous section for transmitting a continuous signal;
a sampling and holding section for operating in response to a first clock signal, connected to the continuous section to transmit a signal which is sampled but is not quantized; and
a digital section connected to the sampling and holding section to transmit a signal which is sampled and quantized,
wherein the first clock signal is a signal in which jitter is added to a basic clock signal,
wherein the continuous section samples an input analog signal,
wherein the sampling and holding section holds the signal sampled by the continuous section,
wherein the continuous section operates in response to a second clock signal,
wherein the second clock signal is a signal in which the jitter is not added to the basic clock signal, and
wherein the first clock signal and the second clock signal have a reverse-phased and non-overlapping relationship.

2. A sampling circuit comprising:
a continuous section for transmitting a continuous signal;
a sampling and holding section for operating in response to a first clock signal, connected to the continuous section to transmit a signal which is sampled but is not quantized; and
a digital section connected to the sampling and holding section to transmit a signal which is sampled and quantized,
wherein the first clock signal is a signal in which jitter is added to a basic clock signal,
wherein the continuous section samples an input analog signal,
wherein the sampling and holding section holds the signal sampled by the continuous section,
wherein the continuous section operates in response to a second clock signal,
wherein the second clock signal is a signal in which the jitter is added to an edge which is a trigger for determining an operation start time of the basic clock signal and the jitter is not added to an edge which is a trigger for determining an operation end time, and
wherein the first clock signal and the second clock signal have a reverse-phased and non-overlapping relationship.

3. A sampling circuit comprising:
a continuous section for transmitting a continuous signal;
a sampling and holding section for operating in response to a first clock signal, connected to the continuous section to transmit a signal which is sampled but is not quantized; and
a digital section connected to the sampling and holding section to transmit a signal which is sampled and quantized,
wherein the first clock signal is a signal in which jitter is added to a basic clock signal,
wherein the sampling and holding section samples a reference signal based on a digital signal from the digital section, and
wherein the continuous section transfers the signal sampled by the sampling and holding section as an analog signal.

4. The sampling circuit according to claim 3, wherein the continuous section operates in response to a second clock signal,
wherein the second clock signal is a signal in which the jitter is not added to the basic clock signal, and
wherein the first clock signal and the second clock signal have a reverse-phased and non-overlapping relationship.

5. The sampling circuit according to claim 3, wherein the continuous section operates in response to a second clock signal,
wherein the second clock signal is a signal in which the jitter is not added to an edge which is a trigger for determining an operation start time of the basic clock signal and the jitter is added to an edge which is a trigger for determining an operation end time, and
wherein the first clock signal and the second clock signal have a reverse-phased and non-overlapping relationship.

6. An A/D converter comprising:
a sampling circuit including a continuous section for sampling an input analog signal, a sampling and holding section for holding the signal sampled by the continuous section, and a digital section for outputting the signal from the sampling and holding section as a digital signal; and
a clock signal supply section for supplying a first clock signal to the sampling and holding section,
wherein the first clock signal is a signal in which jitter is added to a basic clock signal,
wherein the clock signal supply section supplies a second clock signal to the continuous section,
wherein the second clock signal is a signal in which the jitter is not added to the basic clock signal, and
wherein the first clock signal and the second clock signal have a reverse-phased and non-overlapping relationship.

7. An A/D converter comprising:
a sampling circuit including a continuous section for sampling an input analog signal, a sampling and holding section for holding the signal sampled by the continuous section, and a digital section for outputting the signal from the sampling and holding section as a digital signal; and
a clock signal supply section for supplying a first clock signal to the sampling and holding section,
wherein the first clock signal is a signal in which jitter is added to a basic clock signal,
wherein the sampling and holding section includes a capacitive element for accumulating charge generated by the analog signal, and a first switching element for holding and transferring the charge accumulated in the capacitive element to the digital section, and
wherein the first switching element performs an ON operation and an OFF operation in response to the first clock signal.

8. An A/D converter comprising:
a sampling circuit including a continuous section for sampling an input analog signal, a sampling and holding section for holding the signal sampled by the continuous section, and a digital section for outputting the signal from the sampling and holding section as a digital signal; and
a clock signal supply section for supplying a first clock signal to the sampling and holding section,
wherein the first clock signal is a signal in which jitter is added to a basic clock signal,
wherein the clock signal supply section supplies a second clock signal to the continuous section, and
wherein the second clock signal is a signal in which the jitter is added to an edge which is a trigger for determining an operation start time in the basic clock signal and the jitter is not added to an edge which is a trigger for determining an operation end time.

9. The A/D converter according to claim 8, wherein the sampling and holding section includes a capacitive element for accumulating charge generated by the analog signal and a first switching element for holding and transferring the charge accumulated in the capacitive element to the digital section,
wherein the first switching element performs an ON operation and an OFF operation in response to the first clock signal,
wherein the continuous section includes a second switching element for accumulating the charge in the capacitive element, and
wherein the second switching element performs an ON operation and an OFF operation in response to the second clock signal.

10. The A/D converter according to claim 6, wherein the clock signal supply section supplies the first clock signal to the digital section.

11. A D/A converter comprising:
a sampling circuit including a digital section for outputting a digital signal, a sampling and holding section for sampling a reference signal based on the digital signal, and a continuous section for transferring the signal sampled by the sampling and holding section as an analog signal; and
a clock signal supply section for supplying a first clock signal to the sampling and holding section,
wherein the first clock signal is a signal in which jitter is added to a basic clock signal.

12. The D/A converter according to claim 11, wherein the clock signal supply section supplies a second clock signal to the continuous section,
wherein the second clock signal is a signal in which the jitter is not added to the basic clock signal, and
wherein the first clock signal and the second clock signal have a reverse-phased and non-overlapping relationship.

13. The D/A converter according to claim 11, wherein the sampling and holding section includes a capacitive element for accumulating the charge generated by the reference signal, and a first switching element for accumulating the charge in the capacitive element, and
wherein the first switching element performs an ON operation and an OFF operation in response to the first clock signal.

14. The D/A converter according to claim 11, wherein the clock signal supply section supplies a second clock signal to the continuous section,
wherein the second clock signal is a signal in which the jitter is not added to an edge which is a trigger for determining an operation start time of the basic clock signal and the jitter is added to an edge which is a trigger for determining an operation end time, and
wherein the first clock signal and the second clock signal have a reverse-phased and non-overlapping relationship.

15. The D/A converter according to claim 14, wherein the sampling and holding section includes a capacitive element for accumulating the charge generated by the reference signal and a first switching element for accumulating the charge in the capacitive element,
wherein the first switching element performs an ON operation and an OFF operation in response to the first clock signal,
wherein the continuous section includes a second switching element for transferring the charge accumulated in the capacitive element, and
wherein the second switching element performs an ON operation and an OFF operation in response to the second clock signal.

16. The D/A converter according to claim 11, wherein the clock signal supply section supplies the first clock signal to the digital section.

17. A CODEC comprising:
an A/D converter comprising:
a sampling circuit including a continuous section for sampling an input analog signal, a sampling and holding section for holding the signal sampled by the continuous section, and a digital section for outputting the signal from the sampling and holding section as a digital signal; and
a clock signal supply section for supplying a first clock signal to the sampling and holding section,
wherein the first clock signal is a signal in which jitter is added to a basic clock signal, and
a D/A converter comprising:
a sampling circuit including a digital section for outputting a digital signal, a sampling and holding section for sampling a reference signal based on the digital signal, and a continuous section for transferring the signal sampled by the sampling and holding section as an analog signal; and
a clock signal supply section for supplying a first clock signal to the sampling and holding section,
wherein the first clock signal is a signal in which jitter is added to a basic clock signal.

18. The CODEC according to claim 17, wherein the A/D converter and the D/A converter operate asynchronously.

19. A sampling circuit comprising:
a continuous section for transmitting a continuous signal;
a sampling and holding section for operating in response to a first clock signal, connected to the continuous section to transmit a signal which is sampled but is not quantized;
a clock signal supply section for supplying the first clock signal to the sampling and holding section; and
a digital section connected to the sampling and holding section to transmit a signal which is sampled and quantized,
wherein the clock signal supply section includes a circuit for adding jitter to a basic clock signal, and
wherein the first clock signal is a signal in which the jitter is added to the basic clock signal.

20. An A/D converter comprising:
a sampling circuit including a continuous section for sampling an input analog signal, a sampling and holding section for holding the signal sampled by the continuous section, and a digital section for outputting the signal from the sampling and holding section as a digital signal; and
a clock signal supply section for supplying a first clock signal to the sampling and holding section,
wherein the clock signal supply section includes a circuit for adding jitter to a basic clock signal, and
wherein the first clock signal is a signal in which the jitter is added to the basic clock signal.

* * * * *